United States Patent
Tsuchiya et al.

(10) Patent No.: US 7,291,567 B2
(45) Date of Patent: Nov. 6, 2007

(54) SILICA-BASED FILM, METHOD OF FORMING THE SAME, COMPOSITION FOR FORMING INSULATING FILM FOR SEMICONDUCTOR DEVICE, INTERCONNECT STRUCTURE, AND SEMICONDUCTOR DEVICE

(75) Inventors: Hajime Tsuchiya, Kumamoto (JP); Seitaro Hattori, Tsukuha (JP); Masahiro Akiyama, Tsukuba (JP); Atsushi Shiota, Sunnyvale, CA (US)

(73) Assignee: JSR Corporation, Tokyo (JP)

( * ) Notice: Subject to any disclaimer, the term of this patent is extended or adjusted under 35 U.S.C. 154(b) by 288 days.

(21) Appl. No.: 11/184,964

(22) Filed: Jul. 20, 2005

(65) Prior Publication Data

US 2006/0024980 A1 Feb. 2, 2006

(30) Foreign Application Priority Data

Jul. 23, 2004 (JP) ............................. 2004-216346

(51) Int. Cl.
*H01L 21/31* (2006.01)
(52) U.S. Cl. ..................................... 438/761
(58) Field of Classification Search .............. 438/781
See application file for complete search history.

(56) References Cited

U.S. PATENT DOCUMENTS

| 4,822,828 A | 4/1989 | Swofford |
| 4,840,666 A | 6/1989 | Schmidt et al. |

(Continued)

FOREIGN PATENT DOCUMENTS

EP  0 317 858 A2  5/1989

EP  1 122 770 A2  8/2001

(Continued)

OTHER PUBLICATIONS

James L. Hedrick, et al. "Templating Nanoporosity in Thin-Film Dielectric Insulators", Advanced Materials, Research News, vol. 10, No. 13, 1998 pp. 1049-1053.

(Continued)

*Primary Examiner*—Lex Malsawma
(74) *Attorney, Agent, or Firm*—Oblon, Spivak, McClelland, Maier & Neustadt, P.C.

(57) ABSTRACT

A method of forming a silica-based film includes:

applying a composition for forming an insulating film for a semiconductor device, which is cured by using heat and ultraviolet radiation, to a substrate to form a coating; heating the coating; and applying heat and ultraviolet radiation to the coating to effect a curing treatment. The composition includes: a hydrolysis-condensation product produced by hydrolysis and condensation of at least one silane compound selected from the group consisting of compounds shown by the following general formula (A), and at least one silane compound selected from the group consisting of compounds shown by the following general formula (B) and compounds shown by the following general formula (C); and an organic solvent,

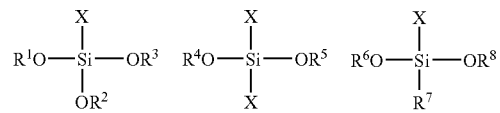

15 Claims, 2 Drawing Sheets

U.S. PATENT DOCUMENTS

| | | | |
|---|---|---|---|
| 4,921,881 | A | 5/1990 | Morlock et al. |
| 6,204,201 | B1 | 3/2001 | Ross |
| 6,235,101 | B1 | 5/2001 | Kurosawa et al. |
| 6,383,913 | B1 | 5/2002 | Tsai et al. |
| 6,413,647 | B1 | 7/2002 | Hayashi et al. |
| 6,495,264 | B2 | 12/2002 | Hayashi et al. |
| 6,809,041 | B2 | 10/2004 | Interrante et al. |
| 2004/0058090 | A1 | 3/2004 | Waldfried et al. |
| 2005/0096415 | A1 | 5/2005 | Akiyama et al. |
| 2006/0024980 | A1 | 2/2006 | Tsuchiya et al. |

FOREIGN PATENT DOCUMENTS

| | | |
|---|---|---|
| JP | 63-248710 | 10/1988 |
| JP | 63-289939 | 11/1988 |
| JP | 1-194980 | 8/1989 |
| JP | 3-30427 | 2/1991 |
| JP | 8-29932 | 3/1996 |
| JP | 2000-109695 | 4/2000 |
| JP | 2000-290590 | 10/2000 |
| JP | 2000-313612 | 11/2000 |
| JP | 2000-327933 | 11/2000 |
| JP | 2001-110802 | 4/2001 |
| JP | 2001-279163 | 10/2001 |
| JP | 2002-38091 | 2/2002 |
| JP | 2002-288268 | 10/2002 |
| JP | 2004-59737 | 2/2004 |
| JP | 2004-149714 | 5/2004 |
| WO | WO 03/025994 A1 | 3/2003 |

OTHER PUBLICATIONS

Ed Mickler, et al., "A Charge Damage Study using an Electron Beam Low k Treatment", Proceedings of the International Interconnect Technology Conference, 2004, 190-192.

H. Miyajima, et al., "The Application of Simultaneous eBeam Cure Method for 65 nm node Cu/Low-k Technology with Hybrid (PAE/MSX) Structure", Proceedings of the International Interconnect Technology Conference, 2004, 222-224.

U.S. Appl. No. 11/432,345, filed May 12, 2006, Shiota.
U.S. Appl. No. 11/393,647, filed Mar. 31, 2006, Shiota.
U.S. Appl. No. 11/596,295, filed Nov. 13, 2006, Akiyama et al.
U.S. Appl. No. 11/596,188, filed Nov. 13, 2006, Akiyama et al.
U.S. Appl. No. 11/484,604, filed Jul. 12, 2006, Nakagawa et al.
U.S. Appl. No. 11/485,508, filed Jul. 13, 2006, Nakagawa et al.
U.S. Appl. No. 11/486,085, filed Jul. 14, 2006, Nakagawa et al.
U.S. Appl. No. 11/489,468, filed Jul. 20, 2006, Akiyama et al.
U.S. Appl. No. 11/580,959, filed Oct. 16, 2006, Akiyama et al.
"STARFIRE® SP-DEPCS", STARFIRE® SYSTEMS, www.starfiresystems.com, May 2005, p. 1.
"STARFIRE® SP-DMPCS", STARFIRE® SYSTEMS, www.starfiresystems.com, May 2005, p. 1.

US 7,291,567 B2

SILICA-BASED FILM, METHOD OF FORMING THE SAME, COMPOSITION FOR FORMING INSULATING FILM FOR SEMICONDUCTOR DEVICE, INTERCONNECT STRUCTURE, AND SEMICONDUCTOR DEVICE

Japanese Patent Application No. 2004-216346, filed on Jul. 23, 2004, is hereby incorporated by reference in its entirety.

BACKGROUND OF THE INVENTION

The present invention relates to a silica-based film, a method of forming the same, a composition for forming an insulating film for a semiconductor device, an interconnect structure, and a semiconductor device.

A silica ($SiO_2$) film formed by a vacuum process such as a CVD process has been widely used as an interlayer dielectric for a semiconductor device used in a large-scale integrated circuit (LSI) or the like. In recent years, in order to form an interlayer dielectric having a more uniform thickness, a spin-on-glass (SOG) film, which is a coating-type insulating film containing an alkoxysilane hydrolysate as the major component, has also been used. Along with an increase in the degree of integration of the LSI, a low-dielectric constant interlayer dielectric containing organic silica sol represented by methyl silsesquioxane (MSQ) has also been developed (U.S. Pat. Nos. 6,235,101, 6,413,647, and 6,495,264).

The organic silica sol is cured by causing the silanol group in the sol to undergo a dehydration-condensation reaction by heating at 350 to 500° C., whereby an insulating film exhibiting a dielectric constant, mechanical strength, and chemical durability suitable as an interlayer dielectric for a semiconductor device can be formed. However, since the reaction of the organic silica sol is a solid-phase reaction, dehydration-condensation does not rapidly proceed due to diffusion control. Therefore, it is necessary to heat the organic silica sol for a long time (e.g. 30 minutes at least; usually one hour or more). In order to perform such a long heat treatment, a batch-type heat treatment furnace capable of treating 50 to 150 wafers at a time has been used to treat a spin-on low-dielectric-constant interlayer dielectric. A semiconductor device which mainly requires a low-dielectric-constant interlayer dielectric is a semiconductor device in the logic device field. However, a logic device interconnect manufacturing step has been tending toward a single-wafer process in which a wafer is rapidly processed one by one. This is because a mainstream logic device such as an ASIC or a custom IC is manufactured in a high-variety low-volume production process. Specifically, the single-wafer process has become the mainstream manufacturing process in order to improve the degrees of freedom of the manufacturing steps.

As a method for rapidly curing a low-dielectric-constant interlayer dielectric composition containing organic silica sol as the major component while improving the strength, a method using electron beams has been proposed (U.S. Pat. No. 6,204,201 and European Patent No. 1122770). This method causes not only a silanol condensation reaction, but also causes decomposition and activation of an organic group in the organic silica-based film to introduce a crosslinked structure such as Si—$CH_x$—Si. A film exhibiting low hygroscopicity and excellent mechanical strength can be obtained by applying electron beams usually within five minutes, whereby the single-wafer processing can be performed. On the other hand, accumulation of an electric charge due to electron beam application may damage the transistor structure in the LSI. Therefore, arguments exist for and against curing a low-dielectric-constant interlayer dielectric composition using electron beams (E. Mickler et al. Proceedings of the International Interconnect Technology Conference, p190, 2004., (Miyajima, et al. Proceedings of the International Interconnect Technology Conference, p. 222, 2004).

A method using ultraviolet radiation is considered as a method for rapidly curing a low-dielectric-constant interlayer dielectric composition containing organic silica sol as the major component without using electron beams. Now, technologies other than the LSI interlayer dielectric technology are considered below. A technology of gelling silica sol by adding a photoacid generator or a photobase generator, which generates an acid or a base upon exposure to ultraviolet radiation, to silica sol and an alkoxysilane to promote a condensation reaction of a silanol and an alkoxide has been known as an optical sol-gel technology, and has been applied to formation of an optical waveguide or the like (e.g. Japanese Patent Application Laid-Open No. 2000-109695). A silica film cured by using a photoacid generator or a photobase generator generally exhibits high hygroscopicity due to a large amount of residual silanol. As a result, the resulting film has a high dielectric constant. The hygroscopicity due to the residual silanol may be reduced by gelling the silica sol by applying ultraviolet radiation and heating the resulting product at about 250 to 500° C. for a predetermined time or more (usually 30 minutes or more). However, this process does not achieve an improvement over the above-described silica film thermal curing method. Moreover, a composition containing a photoacid generator or a photobase generator cannot satisfy the quality as an insulating film for an LSI semiconductor device for which high insulation reliability is demanded, since the photoacid generator, the photobase generator, or an acidic or basic substance generated by the photoacid generator or the photobase generator functions as a charge carrier to impair the insulating properties or causes an interconnect metal to deteriorate.

A siloxane compound is highly transparent to ultraviolet radiation, and has been vigorously studied as a backbone of an $F_2$ photoresist using ultraviolet radiation having a wavelength of 157 nm (e.g. Japanese Patent Application Laid-Open No. 2002-288268). This technology uses a siloxane backbone, but is basically based on the principle of a chemically-amplified photoresist using a KrF or ArF light source. Specifically, a photoacid generator generates an acidic substance upon exposure to ultraviolet radiation, and a chemical bond cleaved by an acid produces a functional group, such as a carboxylic acid, which is readily dissolved in a basic developer. Therefore, this technology does not promote a crosslinking reaction of silica sol by ultraviolet radiation.

The surface of the organic silica-based film cured by applying heat, electron beams, or the like has high hydrophobicity. In order to decrease the surface hydrophobicity, ultraviolet radiation may be applied to the organic silica-based film (e.g. U.S. Pat. No. 6,383,913, Japanese Patent Application Laid-Open No. 63-248710, Japanese Patent Application Laid-Open No. 63-289939, Kokoku publication No. 8-29932, Japanese Patent Application Laid-Open No. 2001-110802). These technologies are characterized in that the surface of the organic silica-based film is oxidized by ozone produced by applying ultraviolet radiation in air so that the hydrophobic surface is changed into a hydrophilic surface having high reactivity, such as a silanol. This modification treatment is mainly performed in order to improve adhesion to a film deposited as the upper layer.

As described above, a technology of applying a polysiloxane resin solution or an organic silica sol solution to a substrate and applying ultraviolet radiation to the resulting film has been widely studied. However, a technology which uses ultraviolet radiation for curing organic silica sol in order to form an interlayer dielectric for an LSI semiconductor device is limited. Japanese Patent Application Laid-Open No. 3-30427, Japanese Patent Application Laid-Open No. 1-194980, International Patent Application No. WO 03/025994, and U.S. patent application Ser. No. 2004/0058090 disclose such limited related-art technologies.

Japanese Patent Application Laid-Open No. 3-30427 discloses a technology in which a solution prepared by dissolving a tetraalkoxysilane (e.g. tetraethoxysilane: TEOS) in collodion is applied to a semiconductor substrate, and ultraviolet radiation is applied to the solution in a nitrogen atmosphere to obtain a silicon dioxide film at a low temperature. The feature of this technology is that highly volatile TEOS is fixed using the collodion, and decomposition of the collodion and dehydration and condensation of TEOS are promoted by applying ultraviolet radiation. Japanese Patent Application Laid-Open No. 1-194980 discloses a technology in which an organosiloxane resin is applied to a substrate, ultraviolet radiation having a dominant wavelength of 254 nm is applied to the resin at a temperature of 200° C. or less to oxidize the surface of the organosiloxane film by ozone produced by ultraviolet radiation, and the oxidized film is heated at 400° C. or more, particularly about 900° C. to obtain a dense silicon dioxide film.

International Patent Application No. WO 03/025994 and U.S. patent application No. 2004/58090 disclose a technology of curing hydrogenated silsesquioxane (HSQ) or MSQ by applying ultraviolet radiation. In this technology, ultraviolet radiation is applied to HSQ or HSQ/MSQ cocondensate in the presence of oxygen so that active oxygen (e.g. ozone) produced in the system promotes oxidation of Si—H in HSQ to form a silica film containing a large amount of $SiO_2$ bond. These references describe that this technology is also effective for curing MSQ in the presence of oxygen rather than the absence of oxygen. Therefore, it is estimated that the $SiO_2$ bond formed by active oxygen is the principal mechanism of the crosslinking reaction. The feature of this technology is the use of ultraviolet radiation, since it is impossible to form the $SiO_2$ bond in a short time using other curing methods. However, while a silica film formed according to this technology has a high modulus of elasticity and high hardness due to an increase in the amount of the $SiO_2$ bond, the moisture absorption and the dielectric constant are increased due to an increase in hydrophilicity of the film. A film having high hygroscopicity generally tends to be damaged by reactive ion etching (RIE) performed in the processing of an interlayer dielectric of a semiconductor device, and exhibits insufficient chemical resistance against a wet cleaning liquid. This tendency significantly occurs in a low-dielectric-constant interlayer dielectric having a porous structure with a dielectric constant k of 2.5 or less. Therefore, (a) an organic silica sol composition which does not include an ionic substance such as a photoacid generator, photobase generator, or photosensitizer, a charge carrier, or a corrosive compound generation source, and can be cured in a short time, (b) a method for curing an organic silica-based film which does not cause damage to a transistor structure and enables single-wafer processing, (c) an organic silica-based film which does not exhibit hygroscopicity and exhibits high hydrophobicity, and (d) an organic silica-based film which exhibits such mechanical strength that the organic silica-based film can withstand formation of a copper damascene structure, are demanded as a low-dielectric-constant interlayer dielectric for an LSI semiconductor device along with a method of forming the same.

An organic silica sol composition for a low-dielectric-constant insulating film used for a semiconductor device is generally designed so that the composition of the organic silica sol is controlled so that an organic silica film obtained by curing the composition by heating has a high modulus of elasticity, taking into consideration the yield in a step in which a dynamic stress occurs, such as chemical mechanical polishing (CMP) or packaging (e.g. U.S. Pat. No. 6,495,264). In more detail, the organic silica sol composition is designed so that the absolute crosslink density in the silica film is increased by increasing the amount of silicon atom which bonds to four oxygen atoms (hereinafter called "component Q") in the organic silica sol to usually 40 mol % or more. The crosslink density is increased by increasing the amount of component Q, whereby a film having a high modulus of elasticity and high hardness can be obtained. However, it is difficult to cause the crosslink site (silanol) of the component Q to completely react. If the amount of component Q is increased to a large extent, the amount of residual silanol is increased after thermal curing, whereby the resulting film exhibits hydrophilicity and high hygroscopicity. In order to compensate for this drawback, cocondensation with an alkoxysilane having a hydrophobic group such as a methyltrialkoxysilane is carried out using a basic catalyst (e.g. ammonia or tetraalkylhydroxyammonium) to produce a sol having a high degree of condensation to reduce the absolute amount of silanol in the sol (U.S. Pat. No. 6,413,647), or the sol having a high degree of condensation is subjected to an additional hydrophobic treatment (Japanese Patent Application Laid-Open No. 2004-59737 and Japanese Patent Application Laid-Open No. 2004-149714). However, since the organic silica sol containing a large amount of component Q has a low molecular chain mobility due to high crosslink density, the diffusion barrier during the solid-phase reaction is very high. The condensation reaction is not promoted even if the organic silica sol containing a large amount of component Q is cured at 400° C. while applying ultraviolet radiation within five minutes. Therefore, a curing time of 30 minutes or more is required for causing the organic silica sol to react.

SUMMARY

A first aspect of the invention relates to a method of forming a silica-based film, the method comprising:

applying a composition for forming an insulating film for a semiconductor device, which is cured by using heat and ultraviolet radiation, to a substrate to form a coating;

heating the coating; and applying heat and ultraviolet radiation to the coating to effect a curing treatment;

wherein the composition includes:

a hydrolysis-condensation product produced by hydrolysis and condensation of at least one silane compound selected from the group consisting of compounds shown by the following general formula (A), and at least one silane compound selected from the group consisting of compounds shown by the following general formula (B) and compounds shown by the following general formula (C); and an organic solvent,

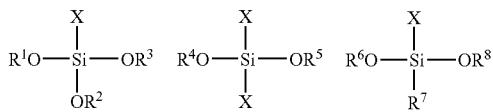
(A)

wherein $R^1$ to $R^8$ individually represent an alkyl group or an aryl group, and X represents the following general formula (A1) or (A2),

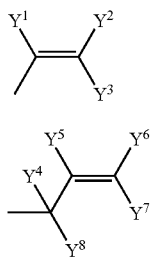

(A1)

(A2)

wherein $Y^1$ to $Y^8$ individually represent a hydrogen atom, a fluorine atom, an alkyl group, or an aryl group, provided that $Y^1$ and $Y^2$ or $Y^5$ and $Y^6$ may form a ring in combination, $$(R^9)_a\!-\!Si\!-\!(OR^{10})_{4-a} \quad (B)$$

wherein $R^9$ and $R^{10}$ represent an alkyl group or an aryl group, and a represents an integer from 0 to 3, $$R^{11}{}_b(R^{12}O)_{3-b}Si\!-\!(R^{15})_d\!-\!Si(OR^{13})_{3-c}R^{14}{}_c \quad (C)$$

wherein $R^{11}$ to $R^{14}$ individually represent an alkyl group or an aryl group, b and c individually represent an integer from 0 to 2, $R^{15}$ represents an oxygen atom, a phenylene group, or a group —$(CH_2)_m$—(wherein m represents an integer from 1 to 6), and d represents 0 or 1.

A second aspect of the invention relates to a silica-based film having a dielectric constant of 1.5 to 3.2, a film density of 0.7 to 1.3 g/cm$^3$, and a water contact angle of 60 degrees or more, the silica-based film being obtained by the above method.

A third aspect of the invention relates to an interconnect structure, comprising the above silica-based film as an interlayer dielectric.

A fourth aspect of the invention relates to a semiconductor device, comprising the above interconnect structure.

A fifth aspect of the invention relates to a composition for forming an insulating film for a semiconductor device, which is used in the above method and is cured by using heat and ultraviolet radiation, the composition comprising:

a hydrolysis-condensation product produced by hydrolysis and condensation of at least one silane compound selected from the group consisting of the compounds shown by the general formula (A), and at least one silane compound selected from the group consisting of the compounds shown by the general formula (B) and the compounds shown by the general formula (C); and an organic solvent.

DETAILED DESCRIPTION OF THE EMBODIMENT

Figure 1:
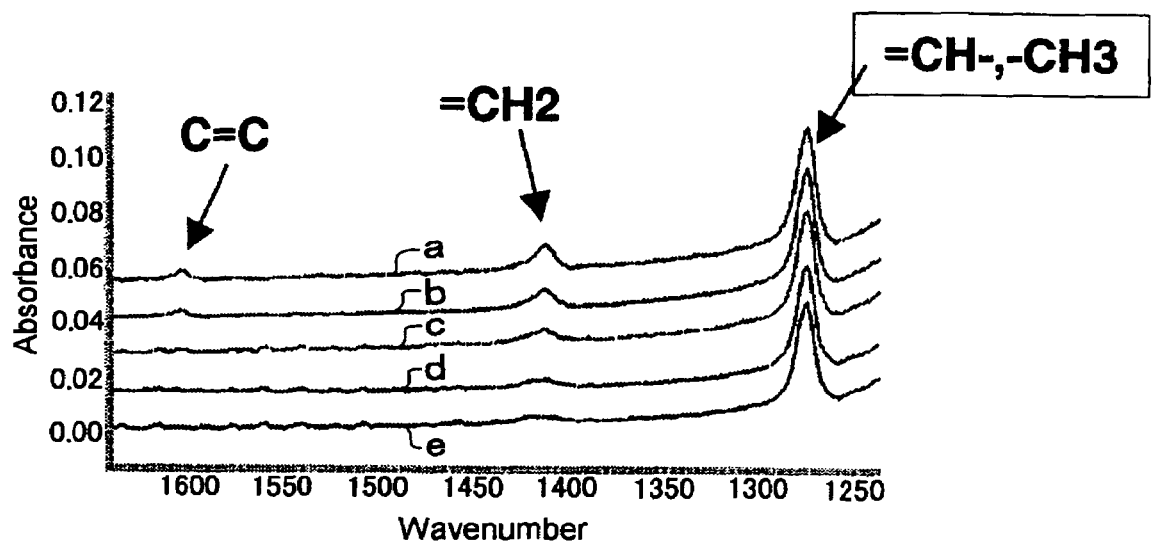
FIG. 1 shows an FT-IR spectrum.

The invention may provide a method of forming a silica-based film capable of forming a silica-based film having a low dielectric constant, excellent mechanical strength, and high hydrophobicity in a short heating time using an insulating film forming composition according to one embodiment of the invention, and a silica-based film.

The invention may also provide a composition for forming an insulating film for a semiconductor device which may be suitably used in the manufacture of an LSI semiconductor device for which an increase in the degree of integration and an increase in the number of layers have been demanded, enables a reduction in heating time by application of ultraviolet radiation, and can form an insulating film having a low dielectric constant and excellent mechanical strength or the like.

The invention may further provide an interconnect structure including the organic silica-based film according to one embodiment of the invention, and a semiconductor device including the interconnect structure.

A method of forming a silica-based film according to an embodiment of the invention includes:

applying a composition for forming an insulating film for a semiconductor device, which is cured by using heat and ultraviolet radiation, to a substrate to form a coating;

heating the coating; and applying heat and ultraviolet radiation to the coating to effect a curing treatment;

wherein the composition includes:

a hydrolysis-condensation product produced by hydrolysis and condensation of at least one silane compound selected from the group consisting of compounds shown by the following general formula (A), and at least one silane compound selected from the group consisting of compounds shown by the following general formula (B) and compounds shown by the following general formula (C); and an organic solvent,

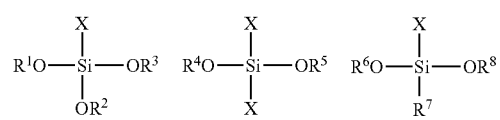
(A)

wherein $R^1$ to $R^8$ individually represent an alkyl group or an aryl group, and X represents the following general formula (A1) or (A2),

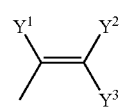
(A1)

-continued

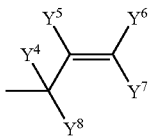
(A2)

wherein Y¹ to Y⁸ individually represent a hydrogen atom, a fluorine atom, an alkyl group, or an aryl group, provided that Y¹ and Y² or Y⁵ and Y⁶ may form a ring in combination,

(B)

wherein $R^9$ and $R^{10}$ represent an alkyl group or an aryl group, and a represents an integer from 0 to 3,

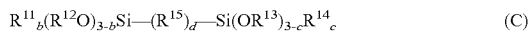
(C)

wherein $R^{11}$ to $R^{14}$ individually represent an alkyl group or an aryl group, b and c individually represent an integer from 0 to 2, $R^{15}$ represents an oxygen atom, a phenylene group, or a group —(CH₂)ₘ— (wherein m represents an integer from 1 to 6), and d represents 0 or 1.

With this method, the heat and the ultraviolet radiation may be applied at the same time.

With this method, the heating may be performed at 100 to 450° C.

With this method, the ultraviolet radiation may have a wavelength of 250 nm or less.

This silica-based film has a dielectric constant of 1.5 to 3.2, a film density of 0.7 to 1.3 g/cm³, and a water contact angle of 60 degrees or more.

An interconnect structure according to an embodiment of the invention includes the above silica-based film as an interlayer dielectric. A semiconductor device according to an embodiment of the invention includes the above interconnect structure.

A composition for forming an insulating film for a semiconductor device according to an embodiment of the invention is used in the above method, is cured by using heat and ultraviolet radiation, and includes:

a hydrolysis-condensation product produced by hydrolysis and condensation of at least one silane compound selected from the group consisting of the compounds shown by the general formula (A), and at least one silane compound selected from the group consisting of the compounds shown by the general formula (B) and the compounds shown by the general formula (C); and an organic solvent.

With this composition, the content of the compounds shown by the general formula (A) in the silane compound may be 60 mol % or less.

With this composition, two or more silane compounds selected from the group consisting of the compounds shown by the general formula (B) and the compounds shown by the general formula (C) may be used.

With this composition, the two or more silane compounds selected from the group consisting of the compounds shown by the general formula (B) and the compounds shown by the general formula (C) may be an alkyltrialkoxysilane and a tetraalkoxysilane.

This composition may not include an ultraviolet radiation active reaction promoter. The reaction promoter may be one of, or a combination of, a reaction initiator, an acid generator, a base generator, and a sensitizer having an ultraviolet radiation absorption function.

With this composition, the content of Na, K, and Fe may be respectively 100 ppb or less.

With this composition, the ultraviolet radiation may have a wavelength of 250 nm or less.

An insulating film having a low dielectric constant and excellent mechanical strength or the like can be formed by applying the composition for forming an insulating film for a semiconductor device (hereinafter simply called "film forming composition"), that is, an organic silica sol composition having a specific composition range, to a substrate, drying the applied composition, and curing the dried composition by heating and ultraviolet radiation application.

The features of a film forming composition and a method of forming a silica-based film according to one embodiment of the invention are described below.

Embodiments of the present invention are described below in detail.

1. Film Forming Composition

A film forming composition according to the invention is cured by using heat and ultraviolet radiation and includes:

a hydrolysis-condensation product (organic silica sol) having an organic group including a carbon-carbon double bond shown by the general formula (A1) or (A2), the hydrolysis-condensation product being produced by hydrolysis and condensation of at least one silane compound selected from the group consisting of compounds shown by the following general formula (A), and at least two silane compounds selected from the group consisting of compounds shown by the following general formulas (B) and (C); and an organic solvent,

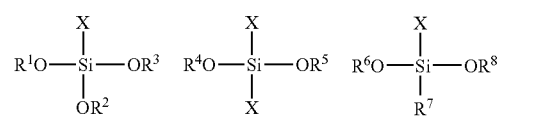
(A)

wherein $R^1$ to $R^8$ individually represent alkyl groups, and X represents the following general formula (A1) or (A2),

(A1)

(A2)

wherein Y¹ to Y⁸ individually represent a hydrogen atom, a fluorine atom, an alkyl group, or an aryl group, provided that Y¹ and Y² or Y⁵ and Y⁶ may form a ring in combination,

(B)

wherein $R^9$ represents an alkyl group or an aryl group, $R^{10}$ represents an alkyl group or an aryl group, and a represents an integer from 0 to 3,

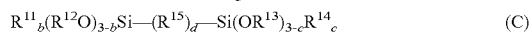

(C)

wherein $R^{11}$ to $R^{14}$ individually represent an alkyl group or an aryl group, b and c individually represent an integer from 0 to 2, $R^{15}$ represents an oxygen atom, a phenylene group, or a group —$(CH_2)_m$— (wherein m represents an integer from 1 to 6), and d represents 0 or 1.

The silane compound, composition, organic solvent, additive, and the like are described below in detail.

1.1 Silane Compound

As the compound shown by the general formula (A) (hereinafter may be called "compound 1"), the compound shown by the general formula (B) (hereinafter may be called "compound 2"), and the compound shown by the general formula (C) (hereinafter may be called "compound 3"), the following compounds may be used.

1.1.1 Compound 1

The compound 1 shown by the general formula (A) is a silane compound including an organic group including a carbon-carbon double bond shown by the general formula (A1) or (A2).

In the general formula (A), $R^1$ to $R^8$ individually represent an alkyl group or an aryl group. As examples of the alkyl group, a methyl group, an ethyl group, a propyl group, a butyl group, and the like can be given. The alkyl group preferably includes 1 to 5 carbon atoms. The alkyl group may be either linear or branched. A hydrogen atom in the alkyl group may be replaced by a fluorine atom or the like. As examples of the aryl group, a phenyl group, a naphthyl group, a methylphenyl group, an ethylphenyl group, a chlorophenyl group, a bromophenyl group, a fluorophenyl group, and the like can be given.

In the general formula (A), X is represented by the general formula (A1) or (A2). In the general formula (A1) or (A2), $Y^1$ to $Y^8$ individually represent a hydrogen atom, a fluorine atom, an alkyl group, or an aryl group, provided that $Y^1$ and $Y^2$ or $Y^5$ and $Y^6$ may form a ring in combination. As examples of the alkyl group and the aryl group, the groups illustrated as the groups $R^1$ to $R^8$ in the general formula (A) can be given.

As examples of the organic group shown by the general formula (A1), a vinyl group, a 1-propenyl group, a 2-propenyl group, a 1-butenyl group, a 2-butenyl group, a 1-pentenyl group, a 1-hexanyl group, a styryl group, a cyclopentanyl group, a cyclohexenyl group, and the like can be given.

As examples of the organic group shown by the general formula (A2), an allyl group, a 2-methylpropenyl group, a 2-butenyl group, a cinnamyl group, a cyclopentenylmethyl group, a cyclohexenylmethyl group, and the like can be given.

A vinyl group, an allyl group, a 2-isopropenyl group, a styryl group, and the like can be given as a preferable organic group shown by the general formula (A1) or (A2).

As specific examples of the compound 1, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-t-butoxysilane, vinyltriphenoxysilane, 1-propenyltrimethoxysilane, 1-propenyltriethoxysilane, 2-propenyltrimethoxysilane, 2-propenyltriethoxysilane, 2-propenyltri-n-propoxysilane, 2-propenyltri-iso-propoxysilane, 2-propenyltri-n-butoxysilane, 2-propenyltri-sec-butoxysilane, 2-propenyltri-t-butoxysilane, 2-propenyltriphenoxysilane, 1-butenyltrimethoxysilane, 1-butenyltriethoxysilane, 1-pentenyltrimethoxysilane, 1-pentenyltriethoxysilane, 1-hexenyltrimethoxysilane, 1-hexenyltriethoxysilane, styryltrimethoxysilane, styryltriethoxysilane, styryltri-n-propoxysilane, styryltri-iso-propoxysilane, styryltri-n-butoxysilane, styryltri-sec-butoxysilane, styryltri-t-butoxysilane, styryltriphenoxysilane, cyclopentenyltrimethoxysilane, cyclopentenyltriethoxysilane, cyclohexenyltrimethoxysilane, clyclohexenyltriethoxysilane, allyltrimethoxysilane, allyltriethoxysilane, allyltri-n-propoxysilane, allyltri-iso-propoxysilane, allyltri-n-butoxysilane, allyltri-sec-butoxysilane, allyltri-t-butoxysilane, allyltriphenoxysilane, 2-methyl propenyltrimethoxysilane, and 2-methyl propenyltriethoxysilane, 2-butenyltrimethoxysilane, 2-butenyltriethoxysilane, (cyclopentenyl)methyltrimethoxysilane, (cyclopentenyl)methyltriethoxysilane, (cyclohexenyl)methyltrimethoxysilane, (cyclohexenyl)methyltriethoxysilane, divinyldimethoxysilane, divinyldiethoxysilane, divinyldi-n-propoxysilane, divinyldi-iso-propoxysilane, divinyldi-n-butoxysilane, divinyldi-sec-butoxysilane, divinyldi-t-butoxysilane, divinyldiphenoxysilane, di-1-propenyldimethoxysilane, di-1-propenyldiethoxysilane, di-2-propenyldimethoxysilane, di-2-propenyldiethoxysilane, di-2-propenyldi-n-propoxysilane, di-2-propenyldi-iso-propoxysilane, di-2-propenyldi-n-butoxysilane, di-2-propenyldi-sec-butoxysilane, di-2-propenyldi-t-butoxysilane, di-2-propenyldiphenoxysilane, di-1-butenyldimethoxysilane, di-1-butenyldiethoxysilane, di-1-pentenyldimethoxysilane, di-1-pentenyldiethoxysilane, di-1-hexanyldimethoxysilane, di-1-hexanyldiethoxysilane, distyryldimethoxysilane, distyryldiethoxysilane, distyryldi-n-propoxysilane, distyryldi-iso-propoxysilane, distyryldi-n-butoxysilane, distyryldi-sec-butoxysilane, distyryldi-t-butoxysilane, distyryldiphenoxysilane, dicyclopentenyldimethoxysilane, dicyclopentenyldiethoxysilane, dicyclohexenyldimethoxysilane, dicyclohexenyldiethoxysilane, diallyldimethoxysilane, diallyldiethoxysilane, diallyldi-n-propoxysilane, diallyldi-iso-propoxysilane, diallyldi-n-butoxysilane, diallyldi-sec-butoxysilane, diallyldi-t-butoxysilane, diallyldiphenoxysilane, di-2-methylpropenyldimethoxysilane, di-2-methyl propenyldiethoxysilane, di-2-butenyldimethoxysilane, di-2-butenyldiethoxysilane, di(cyclopentenyl)methyldimethoxysilane, di(cyclopentenyl)methyldiethoxysilane, di(cyclohexenyl)methyldimethyloxysilane, di(cyclohexenyl)methyldiethoxysilane, methylvinyldimethoxysilane, methylvinyldiethoxysilane, methylvinyldi-n-propoxysilane, methylvinyldi-iso-propoxysilane, methylvinyldi-n-butoxysilane, methylvinyldi-sec-butoxysilane, methylvinyldi-t-butoxysilane, methylvinyldiphenoxysilane, ethylvinyldimethoxysilane, ethylvinyldiethoxysilane, n-propylvinyldimethoxysilane, n-propylvinyldiethoxysilane, iso-propylvinyldimethoxysilane, iso-propylvinyldiethoxysilane, n-butylvinyldimethoxysilane, n-butylvinyldiethoxysilane, iso-butylvinyldimethoxysilane, iso-butylvinyldiethoxysilane, sec-butylvinyldimethoxysilane, sec-butylvinyldiethoxysilane, tert-butylvinyldimethoxysilane, tert-butylvinyldiethoxysilane, phenylvinyldimethoxysilane, phenylvinyldiethoxysilane, methyl-2-propenyldimethoxysilane, methyl-2-propenyldiethoxysilane, methyl styryldimethoxysilane, methylstyryldiethoxysilane, allylmethyldimethoxysilane, allylmethyldiethoxysilane, allylmethyldi-n-propoxysilane, allylmethyldi-iso-propoxysilane, allylmethyldi-n-butoxysilane, allylmethyldi-sec-butoxysilane, allylmethyldi-t-butoxysilane, allylmethyldiphenoxysilane, allylethyldimethoxysilane, allylethyldiethoxysilane, allyl-n-propyldimethoxysilane, allyl-n-propyldiethoxysilane, allyl-iso-propyldimethoxysilane, allyl-iso-propyldiethoxysilane, allyl-n-butyldimethoxysilane, allyl-n-butyldiethoxysilane, allyl-iso-butyldimethoxysilane, allyl-iso-butyldiethoxysilane, allyl-sec-butyldimethoxysilane, allyl-sec-butyldiethoxysilane, allyl-t-butyldimethoxysilane, allyl-t-butyldiethoxysilane, allylphenyldimethoxysilane, allylphenyldiethoxysilane, and the like can be given.

Of these, vinyltrimethoxysilane, vinyltriethoxysilane, 2-propenyltrimethoxysilane, 2-propenyltriethoxysilane, styryltrimethoxysilane, styryltriethoxysilane, allyltrimethoxysilane, allyltriethoxysilane, divinyldiethoxysilane, di-2-propenyldimethoxysilane, di-2-propenyldiethoxysilane, distyryldimethoxysilane, distyryldiethoxysilane, diallyldimethoxysilane, diallyldiethoxysilane, methylvinyldimethoxysilane, methylvinyldiethoxysilane, allylmethyldimethoxysilane, allylmethyldiethoxysilane, and the like are particularly preferable as the compound 1.

1.1.2 Compound 2

As examples of $R^9$ to $R^{10}$ in the general formula (B), the groups illustrated as the groups $R^1$ to $R^8$ in the general formula (A) can be given.

As examples of the compounds shown by the general formula (B) in which a is 0, tetramethoxysilane, tetraethoxysilane, tetra-n-propoxysilane, tetra-iso-propoxysilane, tetra-n-butoxysilane, tetra-sec-butoxysilane, tetra-t-butoxysilane, tetraphenoxysilane, and the like can be given. Of these, tetramethoxysilane and tetraethoxysilane are preferable. These compounds may be used either individually or in combination of two or more.

As examples of the compounds shown by the general formula (B) in which a is 1, methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-t-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-t-butoxysilane, iso propyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-t-butoxysilane, n-butyltriphenoxysilane, sec-butyltrimethoxysilane, sec-butyliso-triethoxysilane, sec-butyltri-n-propoxysilane, sec-butyltriisopropoxysilane, sec-butyltri-n-butoxysilane, sec-butyltri-sec-butoxysilane, sec-butyltri-t-butoxysilane, sec-butyltriphenoxysilane, tert-butyltrimethoxysilane, tert-butyltriethoxysilane, tert-butyltri-n-propoxysilane, tert-butyltri isopropoxysilane, tert-butyltri-n-butoxysilane, tert-butyltri-sec-butoxysilane, tert-butyltri-t-butoxysilane, tert-butyltriphenoxysilane, trimethoxysilane, triethoxysilane, tri-n-propoxysilane, triisopropoxysilane, tri-n-butoxysilane, tri-sec-butoxysilane, tri-t-butoxysilane, and triphenoxysilane can be given. Of these, methyltrimethoxysilane, methyltriethoxysilane, methyltri-n-propoxysilane, methyltri-iso-propoxysilane, ethyltrimethoxysilane, and ethyltriethoxysilane can be given as preferable compounds. These compounds may be used either individually or in combination of two or more.

As examples of the compounds shown by the general formula (B) in which a is 2, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-t-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-t-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-t-butoxysilane, di-n-propyldi-phenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-t-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-t-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-t-butoxysilane, di-sec-butyldi-phenoxysilane, di-t-butyldimethoxysilane, di-t-butyldiethoxysilane, di-t-butyldi-n-propoxysilane, di-t-butyldiisopropoxysilane, di-t-butyldi-n-butoxysilane, di-t-butyldi-sec-butoxysilane, di-t-butyldi-t-butoxysilane, and di-t-butyldi-phenoxysilane, can be given. Of these, dimethyldimethoxysilane, dimethyldiethoxysilane, diethyldimethoxysilane, diethyldiethoxysilane, and the like can be given preferable compounds. These compounds may be used either individually or in combination of two or more.

As examples of the compounds shown by the general formula (B) in which a is 3, trimethylmethoxysilane, trimethylethoxysilane, trimethyl-n-propoxysilane, trimethylisopropoxysilane, trimethyl-n-butoxysilane, trimethyl-sec-butoxysilane, trimethyl-t-butoxysilane, trimethylphenoxysilane, triethylmethoxysilane, and triethylethoxysilane can be given. Of these, trimethylmethoxysilane, trimethylethoxysilane, and triethylmethoxysilane can be given preferable compounds. These compounds may be used either individually or in combination of two or more.

1.1.3 Compound 3

As examples of $R^{11}$ to $R^{14}$ in the general formula (C), the groups illustrated as the groups $R^1$ to $R^8$ in the general formula (A) can be given.

As examples of the compounds shown by the general formula (C) in which d is 0, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2- triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compounds shown by the general formula (C) in which $R^{15}$ is represented by —$(CH_2)_m$—, bis(trimethoxysilyl)methane, bis(triethoxysilyl)methane, bis(tri-n-propoxysilyl)methane, bis(tri-i-propoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-i-propoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-i-propoxymethylsilyl)-1-(tri-i-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-i-propoxymethylsilyl)-2-(tri-i-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-i-propoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-i-propoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-i-propoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-i-propoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-i-propoxysilyl)benzene, 1,4-bis(tri-n-butoxysilyl)benzene, 1,4-bis(tri-sec-butoxysilyl)benzene, 1,4-bis(tri-t-butoxysilyl)benzene, and the like can be given.

Of these, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

The above arbitrary compounds may be used either individually or in combination of two or more.

1.1.4 Composition of Silane Compound

In the film forming composition of the invention, the total amount of the compound 1 used is 60 mol % or less, and preferably 5 mol % or more but 50 mol % or less. If the amount of the compound 1 exceeds 60 mol %, a side reaction other than elimination, such as polymerization of the substituents shown by the general formula (A1) or (A2), may occur.

At least one compound may be selected from the group consisting of the compound 2 and the compound 3. However, if two or more compounds are selected from the group consisting of the compound 2 and the compound 3, an insulating film provided with well-balanced performance can be formed.

When using two or more compounds selected from the group consisting of the compound 2 and the compound 3, it is preferable to select an alkyltrialkoxysilane and a tetraalkoxysilane.

The film forming composition of the invention may not include a reaction promoter having ultraviolet radiation activity. The reaction promoter used herein refers to one of, or a combination of, a reaction initiator, a catalyst (acid generator or base generator), and a sensitizer having a UV absorption function. The feature of the film forming composition of the invention is that the film forming composition can be cured by ultraviolet radiation application in combination with heating without using such a reaction promoter. This is considered to be because the organic group X of the compound 1 absorbs ultraviolet radiation to undergo excitation and elimination so that the condensation reaction proceeds. This is also estimated from examples described later. Therefore, the film forming composition may include the compound 1 in such a range that oxidation of the substituent or a reaction between the substituents is not initiated.

When subjecting the compounds 1 to 3 to hydrolysis and condensation, water may be added in an amount of 0.1 to 100 mol for one mol of the group represented by OR in the general formulas (A) to (C).

The hydrolysis-condensation product of the film forming composition of the invention preferably has a polystyrene-reduced weight average molecular weight of 500 to 500,000. If the molecular weight is to great, particles tend to be formed. Moreover, the size of the pore in the organic silica-based film is increased to a large extent. If the molecular weight is too small, a problem may occur relating to applicability and storage stability. The complete hydrolysis-condensation product used herein refers to a product in which the groups represented by OR are entirely hydrolyzed to become OH groups and are completely condensed.

1.1.5 Method of Producing Film Forming Composition

The film forming composition of the invention may be obtained by mixing the compounds 1 to 3 and an organic solvent containing water and optionally heating the mixture. As the organic solvent, an organic solvent described in 1.2 may be used.

In the invention, the hydrolysis and condensation may be carried out in the presence of a metal chelate compound, an acidic compound, or a basic compound. The hydrolysis and condensation may be carried out using the metal chelate compound or the acidic compound when an insulating film after application and curing has a dielectric constant of 2.6 to 3.2, and hydrolysis and condensation may be carried out using the basic compound when an insulating film has a dielectric constant of 1.5 to 3.0, although the invention is not limited thereto. The metal chelate compound, the acidic compound, and the basic compound are described below.

Metal Chelate Compound

The metal chelate compound which may be used at the time of hydrolysis and condensation of the compounds 1 to 3 is shown by the following general formula (1).

$$R^{16}_{\beta}M(OR^{17})_{\alpha-\beta} \quad (1)$$

wherein $R^{16}$ represents a chelating agent, M represents a metal atom, $R^{17}$ represents an alkyl group having 2 to 5 carbon atoms or an aryl group having 6 to 20 carbon atoms, a represents the valence of the metal M, and $\beta$ represents an integer from 1 to $\alpha$.

As the metal M, at least one metal selected from the group IIIB metals (aluminum, gallium, indium, and thallium) and the group IVA metals (titanium, zirconium, and hafnium) is preferable, with titanium, aluminum, and zirconium being still more preferable.

As specific examples of the metal chelate compound, titanium chelate compounds such as triethoxy.mono(acetylacetonate)titanium, tri-n-propoxy.mono(acetylacetonate)titanium, tri-i-propoxy.mono(acetylacetonate)titanium, tri-n-butoxy.mono(acetylacetonate)titanium, tri-sec-butoxy.mono(acetylacetonate)titanium, tri-t-butoxy.mono(acetylacetonate)titanium, diethoxy.bis(acetylacetonate)titanium, di-n-propoxy.bis(acetylacetonate)titanium, di-i-propoxy.bis(acetylacetonate)titanium, di-n-butoxy.bis(acetylacetonate)titanium, di-sec-butoxy.bis(acetylacetonate)titanium, di-t-butoxy.bis(acetylacetonate)titanium, monoethoxy.tris(acetylacetonate)titanium, mono-n-propoxy.tris(acetylacetonate)titanium, mono-i-propoxy.tris(acetylacetonate)titanium, mono-n-butoxy.tris(acetylacetonate)titanium, mono-sec-butoxy.tris(acetylacetonate)titanium, mono-t-butoxy.tris(acetylacetonate)titanium, tetrakis(acetylacetonate)titanium, triethoxy.mono(ethylacetoacetate)titanium, tri-n-propoxy.mono(ethylacetoacetate)titanium, tri-i-propoxy.mono(ethylacetoacetate)titanium, tri-n-butoxy.mono(ethylacetoacetate)titanium, tri-sec-butoxy.mono(ethylacetoacetate)titanium, tri-t-butoxy.mono(ethylacetoacetate)titanium, diethoxy.bis(ethylacetoacetate)titanium, di-n-propoxy.bis(ethylacetoacetate)titanium, di-i-propoxy.bis(ethylacetoacetate)titanium, di-n-butoxy.bis(ethylacetoacetate)titanium, di-sec-butoxy.bis(ethylacetoacetate)titanium, di-t-butoxy.bis(ethylacetoacetate)titanium, monoethoxy.tris(ethylacetoacetate)titanium, mono-n-propoxy.tris(ethylacetoacetate)titanium, mono-i-propoxy.tris(ethylacetoacetate)titanium, mono-n-butoxy.tris(ethylacetoacetate)titanium, mono-sec-butoxy.tris(ethylacetoacetate)titanium, mono-t-butoxy.tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy.mono(acetylacetonate)zirconium, tri-n-propoxy.mono(acetylacetonate)zirconium, tri-i-propoxy.mono(acetylacetonate)zirconium, tri-n-butoxy.mono(acetylacetonate)zirconium, tri-sec-butoxy.mono(acetylacetonate)zirconium, tri-t-butoxy.mono(acetylacetonate)zirconium, diethoxy.bis(acetylacetonate)zirconium, di-n-propoxy.bis(acetylacetonate)zirconium, di-i-propoxy.bis(acetylacetonate)zirconium, di-n-butoxy.bis(acetylacetonate)zirconium, di-sec-butoxy.bis(acetylacetonate)zirconium, di-t-butoxy.bis(acetylacetonate)zirconium, monoethoxy.tris(acetylacetonate)zirconium, mono-n-propoxy.tris(acetylacetonate)zirconium, mono-i-propoxy.tris(acetylacetonate)zirconium, mono-n-butoxy.tris(acetylacetonate)zirconium, mono-sec-butoxy.tris(acetylacetonate)zirconium, mono-t-butoxy.tris(acetylacetonate)zirconium, tetrakis(acetylacetonate)zirconium, triethoxy.mono(ethylacetoacetate)zirconium, tri-n-propoxy.mono(ethylacetoacetate)zirconium, tri-i-propoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethylacetoacetate)zirconium, diethoxy.bis(ethylacetoacetate)zirconium, di-n-propoxy.bis(ethylacetoacetate)zirconium, di-i-propoxy.bis(ethylacetoacetate)zirconium, di-n-butoxy.bis(ethylacetoacetate)zirconium, di-sec-butoxy.bis(ethylacetoacetate)zirconium, di-t-butoxy.bis(ethylacetoacetate)zirconium, monoethoxy.tris(ethylacetoacetate)zirconium, mono-n-propoxy.tris(ethylacetoacetate)zirconium, mono-i-propoxy.tris(ethylacetoacetate)zirconium, mono-n-butoxy.tris(ethylacetoacetate)zirconium, mono-sec-butoxy.tris(ethylacetoacetate)zirconium, mono-t-butoxy.tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate) zirconium; and aluminum chelate compounds such as triethoxy.mono(acetylacetonate)aluminum, tri-n-propoxy.mono(acetylacetonate)aluminum, tri-i-propoxy.mono(acetylacetonate) aluminum, tri-n-butoxy.mono(acetylacetonate)aluminum, tri-sec-butoxy.mono(acetylacetonate)aluminum, tri-t-butoxy.mono(acetylacetonate)aluminum, diethoxy.bis(acetylacetonate)aluminum, di-n-propoxy.bis(acetylacetonate)aluminum, di-i-propoxy.bis(acetylacetonate)aluminum, di-n-butoxy.bis(acetylacetonate)aluminum, di-sec-butoxy.bis(acetylacetonate)aluminum, di-t-butoxy.bis(acetylacetonate)aluminum, monoethoxy.tris(acetylacetonate)aluminum, mono-n-propoxy.tris(acetylacetonate)aluminum, mono-i-propoxy.tris(acetylacetonate)aluminum, mono-n-butoxy.tris(acetylacetonate)aluminum, mono-sec-butoxy.tris(acetylacetonate)aluminum, mono-t-butoxy.tris(acetylacetonate)aluminum, tetrakis(acetylacetonate)aluminum, triethoxy.mono(ethylacetoacetate)aluminum, tri-n-propoxy.mono(ethylacetoacetate)aluminum, tri-i-propoxy.mono(ethylacetoacetate)aluminum, tri-n-butoxy.mono(ethylacetoacetate)aluminum, tri-sec-butoxy.mono(ethylacetoacetate)aluminum, tri-t-butoxy.mono(ethylacetoacetate)aluminum, diethoxy.bis(ethylacetoacetate)aluminum, di-n-propoxy.bis(ethylacetoacetate)aluminum, di-i-propoxy.bis(ethylacetoacetate)aluminum, di-n-butoxy.bis(ethylacetoacetate)aluminum, di-sec-butoxy.bis(ethylacetoacetate)aluminum, di-t-butoxy.bis(ethylacetoacetate)aluminum, monoethoxy.tris(ethylacetoacetate)aluminum, mono-n-propoxy.tris(ethylacetoacetate)aluminum, mono-i-propoxy.tris(ethylacetoacetate)aluminum, mono-n-butoxy.tris(ethylacetoacetate)aluminum, (ethylacetoacetate)aluminum, mono-sec-butoxy.tris(ethylacetoacetate)aluminum, mono-t-butoxy.tris(ethylacetoacetate)aluminum, tetrakis(ethylacetoacetate) aluminum, mono(acetylacetonate)tris(ethylacetoacetate) aluminum, bis(acetylacetonate)bis(ethylacetoacetate) aluminum, and tris(acetylacetonate)mono(ethylacetoacetate) aluminum can be given.

In particular, at least one of $(CH_3COCH_2COCH_3)_r$, $(CH_3COCH_2COOC_2H_5)_r$, $(CH_3COCH_2COCH_3)_r$, $(CH_3COCH_2COOC_2H_5)_r$, $(CH_3COCH_2COCH_3)_r$, $(CH_3COCH_2COOC_2H_5)_r$, $(CH_3COCH_2COCH_3)_r$, $(CH_3COCH_2COOC_2H_5)_r$, $(CH_3COCH_2COCH_3)_r$, $(CH_3COCH_2COOC_2H_5)_r$, $(CH_3COCH_2COCH_3)_3$, $(CH_3COCH_2COOC_2H_5)_r$, $(CH_3COCH_2COCH_3)_r$, $(CH_3COCH_2COOC_2H_5)_r$, $(CH_3COCH_2COCH_3)_r$, $(CH_3COCH_2COOC_2H_5)_r$, $(CH_3COCH_2COCH_3)_r$, $(CH_3COCH_2COOC_2H_5)_r$, and the like is preferable as the metal chelate compound, paired respectively with $(CH_3(CH_3)HCO)_{4-r}Ti$, $(CH_3(CH_3)HCO)_{4-r}Ti$, $(C_4H_9O)_{4-r}Ti$, $(C_4H_9O)_{4-r}Ti$, $(C_2H_5(CH_3)CO)_{4-r}Ti$, $(C_2H_5(CH_3)CO)_{4-r}Ti$, $(CH_3(CH_3)HCO)_{4-r}Zr$, $(CH_3(CH_3)HCO)_{4-r}Zr$, $(C_4H_9O)_{4-r}Zr$, $(C_4H_9O)_{4-r}Zr$, $(C_2H_5(CH_3)CO)_{4-r}Zr$, $(C_2H_5(CH_3)CO)_{4-r}Zr$, $(CH_3(CH_3)HCO)_{3-r}Al$, $(CH_3(CH_3)HCO)_{3-r}Al$, $(C_4H_9O)_{3-r}Al$, $(C_4H_9O)_{3-r}Al$, $(C_2H_5(CH_3)CO)_{3-r}Al$, $(C_2H_5(CH_3)CO)_{3-r}Al$.

The metal chelate compound is used in an amount of 0.0001 to 10 parts by weight, and preferably 0.001 to 5 parts by weight for 100 parts by weight of the compounds 1 to 3 in total (converted to complete hydrolysis-condensation product) at the time of hydrolysis and condensation. If the amount of the metal chelate compound is less than 0.0001 parts by weight, coating applicability may be decreased. If the amount of the metal chelate compound exceeds 10 parts by weight, the crack resistance of the coating may be decreased. The metal chelate compound may be added in advance to the organic solvent at the time of hydrolysis and condensation together with the compounds 1 to 3, or may be dissolved or dispersed in water when adding water.

When subjecting the compounds 1 to 3 to hydrolysis and condensation in the presence of the metal chelate compound, it is preferable to add water in an amount of 0.5 to 20 mol, and particularly preferably 1 to 10 mol for one mol of the compounds 1 to 3 in total. If the amount of water added is less than 0.5 mol, the crack resistance of the coating may be decreased. If the amount exceeds 20 mol, polymer precipitation or gelation may occur during the hydrolysis and condensation reaction. It is preferable that the water be added intermittently or continuously.

Acidic Compound

As the acidic compound which may be used at the time of hydrolysis and condensation of the compounds 1 to 3, organic acids or inorganic acids can be given. As examples of the organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, maleic anhydride, fumaric acid, itaconic acid, succinic acid, mesaconic acid, citraconic acid, malic acid, malonic acid, hydrolysate of glutaric acid, hydrolysate of maleic anhydride, hydrolysate of phthalic anhydride, and the like can be given. As examples of the inorganic acids, hydrochloric acid, nitric acid, sulfuric acid, hydrofluoric acid, phosphoric acid, and the like can be given. In particular, the organic acids are preferable since polymer precipitation or gelation rarely occurs during the hydrolysis and condensation reaction. Among the organic acids, a compound including a carboxyl group is still more preferable. In particular, acetic acid, oxalic acid, maleic acid, formic acid, malonic acid, phthalic acid, fumaric acid, itaconic acid, succinic acid, mesaconic acid, citraconic acid, malic acid, glutaric acid, and a hydrolysate of maleic anhydride are preferable. These compounds may be used either individually or in combination of two or more.

The acidic compound is used in an amount of 0.0001 to 10 parts by weight, and preferably 0.001 to 5 parts by weight for 100 parts by weight of the compounds 1 to 3 in total (converted to complete hydrolysis-condensation product) at the time of hydrolysis and condensation. If the amount of the acidic compound used is less than 0.0001 parts by weight, coating applicability may be decreased. If the amount of the metal chelate compound exceeds 10 parts by weight, the crack resistance of the coating may be decreased. The acidic compound may be added in advance to the organic solvent at the time of hydrolysis and condensation together with the compounds 1 to 3, or may be dissolved or dispersed in water when adding water.

When subjecting the compounds 1 to 3 to hydrolysis and condensation in the presence of the acidic compound, it is preferable to add water in an amount of 0.5 to 20 mol, and particularly preferably 1 to 10 mol for one mol of the compounds 1 to 3 in total. If the amount of water added is less than 0.5 mol, the crack resistance of the coating may be decreased. If the amount exceeds 20 mol, polymer precipitation or gelation may occur during the hydrolysis and condensation reaction. It is preferable that the water be added intermittently or continuously.

Basic Compound

As examples of the basic compounds which may be used at the time of hydrolysis and condensation of the compounds 1 to 3, sodium hydroxide, potassium hydroxide, lithium hydroxide, cerium hydroxide, barium hydroxide, calcium hydroxide, pyridine, pyrrole, piperazine, pyrrolidine, piperidine, picoline, ammonia, methylamine, ethylamine, propylamine, butylamine, dimethylamine, diethylamine, dipropylamine, dibutylamine, trimethylamine, triethylamine, tripropylamine, tributylamine, monoethanolamine, diethanolamine, dimethylmonoethanolamine, monomethyldiethanolamine, triethanolamine, diazabicyclooctane, diazabicyclononane, diazabicycloundecene, urea, tetramethylammonium hydroxide, tetraethylammonium hydroxide, tetrapropylammonium hydroxide, tetrabutylammonium hydroxide, benzyltrimethylammonium hydroxide, choline, and the like can be given. Of these, ammonia, organic amines, and ammonium hydroxides are preferable, with tetramethylammonium hydroxide, tetraethylammonium hydroxide, and tetrapropylammonium hydroxide being particularly preferable. The basic compound may be used either individually or in combination of two or more.

The basic compound is used in an amount of usually 0.00001 to 1 mol, and preferably 0.00005 to 0.5 mol for one mol of the total amount of the alkoxyl groups of the compounds 1 to 3. If the amount of the basic compound used is within the above range, polymer precipitation or gelation rarely occurs during the reaction.

When subjecting the compounds 1 to 3 to hydrolysis and condensation in the presence of the basic compound, it is preferable to add water in an amount of 0.5 to 150 mol, and particularly preferably 0.5 to 130 mol for one mol of the compounds 1 to 3 in total. If the amount of water added is less than 0.5 mol, the crack resistance of the coating may be decreased. If the amount exceeds 150 mol, polymer precipitation or gelation may occur during the hydrolysis and condensation reaction.

In this case, it is preferable to use an alcohol having a boiling point of 100° C. or less together with water. As examples of the alcohol having a boiling point of 100° C. or less used, methanol, ethanol, n-propanol, and isopropanol can be given. The alcohol having a boiling point of 100° C. or less is used in an amount of usually 3 to 100 mol, and preferably 5 to 80 mol for one mol of the compounds 1 to 3 in total.

The alcohol having a boiling point of 100° C. or less may be produced during hydrolysis and/or condensation of the compounds 1 to 3. In this case, it is preferable to remove the alcohol having a boiling point of 100° C. or less by distillation or the like so that the content becomes 20 wt % or less, and preferably 5 wt % or less. A dehydrating agent such as methyl orthoformate, a metal complex, or a leveling agent may be included as an additive.

After obtaining a hydrolysis-condensation product from the compounds 1 to 3 in the presence of the basic compound, it is preferable to adjust the pH of the film forming composition (I) of the invention to 7 or less. As the pH adjustment method, 1) a method of adding a pH adjustment agent, 2) a method of evaporating the basic compound from the composition under normal pressure or reduced pressure, 3) a method of removing the basic compound from the composition by bubbling a gas such as nitrogen or argon through the composition, 4) a method of removing the basic compound from the composition using an ion-exchange resin, 5) a method of removing the basic compound from the system by extraction or washing, and the like can be given. These methods may be used in combination.

As the pH adjustment agent, inorganic acids and organic acids can be given. As examples of the inorganic acids, hydrochloric acid, nitric acid, sulfuric acid, hydrofluoric acid, phosphoric acid, boric acid, oxalic acid, and the like can be given. As examples of the organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, itaconic acid, mesaconic acid, citraconic acid, malic acid, hydrolysate of glutaric acid, hydrolysate of maleic anhydride, hydrolysate of phthalic anhydride, and the like can be given. These compounds may be used either individually or in combination of two or more.

The pH of the composition is adjusted to 7 or less, and preferably 1 to 6 using the pH adjustment agent. The storage stability of the composition (I) is improved by adjusting the pH within the above range using the pH adjustment agent. The pH adjustment agent is used in such an amount that the pH of the composition (I) is within the above range. The amount of the pH adjustment agent is appropriately selected.

Organic Solvent

In the invention, the silane compounds 1 to 3 may be subjected to hydrolysis and condensation in an organic solvent. The organic solvent is preferably a solvent shown by the following general formula (2).

wherein $R^{18}$ and $R^{19}$ individually represent a hydrogen atom or a monovalent organic group selected from an alkyl group having 1 to 4 carbon atoms and $CH_3CO-$, and $\gamma$ represents 1 or 2.

As examples of the alkyl groups having 1 to 4 carbon atoms in the general formula (2), the groups given as the alkyl groups for the general formula (1) can be given.

As specific examples of the organic solvent shown by the general formula (2), propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, dipropylene glycol monopropyl ether acetate, dipropylene glycol monobutyl ether acetate, propylene glycol diacetate, dipropylene glycol diacetate, and the like can be given. Of these, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferable. These solvents may be used either individually or in combination of two or more. Another solvent such as an ester solvent and an amide solvent may be included in a small amount together with the solvent shown by the general formula (2).

The total solid content of the film forming composition of the invention is appropriately adjusted depending on the target application, preferably in the range of 0.1 to 10 wt %. If the total solid content of the film forming composition of the invention is 0.1 to 10 wt %, the resulting coating has a thickness within an appropriate range, and the composition exhibits a more excellent storage stability. The total solid content is adjusted by concentration or dilution with an organic solvent, if necessary.

1.2 Organic Solvent

As the organic solvent which may be used in the invention, at least one solvent selected from the group consisting of alcohol solvents, ketone solvents, amide solvents, ether solvents, ester solvents, aliphatic hydrocarbon solvents, aromatic solvents, and halogen-containing solvents may be used.

Examples of the alcohol solvents include: monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol solvents such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like. These alcohol solvents may be used either individually or in combination of two or more.

As examples of the ketone solvents, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclopentanone, cyclohexanone, cycloheptanone, cyclooctanone, 2-hexanone, methylcyclohexanone, 2,4-pentanedione, acetonylacetone, diacetone alcohol, acetophenone, fenchone, and the like can be given. These ketone solvents may be used either individually or in combination of two or more.

As examples of the amide solvents, nitrogen-containing solvents such as N,N-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like can be given. These amide solvents may be used either individually or in combination of two or more.

As examples of the ether solvents, ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol dimethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, 2-methyltetrahydrofuran, diphenyl ether, anisole, and the like can be given. These ether solvents may be used either individually or in combination of two or more.

As examples of the ester solvents, diethyl carbonate, propylene carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like can be given. These ester solvents may be used either individually or in combination of two or more.

As examples of the aliphatic hydrocarbon solvents, n-pentane, i-pentane, n-hexane, i-hexane, n-heptane, i-heptane, 2,2,4-trimethylpentane, n-octane, i-octane, cyclohexane, methylcyclohexane, and the like can be given. These aliphatic hydrocarbon solvents may be used either individually or in combination of two or more.

As examples of the aromatic hydrocarbon solvents, benzene, toluene, xylene, ethylbenzene, trimethylbenzene, methylethylbenzene, n-propylbenzene, i-propylebenzene, diethylbenzene, i-butylbenzene, triethylbenzene, di-i-propylbenzene, n-amylnaphthalene, trimethylbenzene, and the like can be given. These aromatic hydrocarbon solvents may be used either individually or in combination of two or more. As examples of the halogen-containing solvents, dichloromethane, chloroform, fluorocarbon, chlorobenzene, dichlorobenzene, and the like can be given.

In the invention, it is preferable to use an organic solvent having a boiling point of less than 150° C. As the type of solvent, an alcohol solvent, a ketone solvent, and an ester solvent are particularly preferable. It is preferable to use one or more of these solvents.

1.3 Other Additives

The film forming composition of the invention may further include components such as an organic polymer, a surfactant, and a silane coupling agent. These additives may be added to the solvent in which each component has been dissolved or dispersed before producing the film forming composition.

1.3.1 Organic Polymer

The organic polymer used in the invention may be added as a readily decomposable component for forming voids in the silica-based film. The addition of such an organic polymer is described in references such as Japanese Patent Application Laid-Open No. 2000-290590, Japanese Patent Application Laid-Open No. 2000-313612, and Hedrick, J. L., et al. "Templating Nanoporosity in Thin Film Dielectric Insulators", Adv. Mater., 10 (13), 1049, 1998. An organic polymer similar to those described in these references may be added.

As examples of the organic polymer, a polymer having a sugar chain structure, vinyl amide polymer, (meth)acrylic polymer, aromatic vinyl compound polymer, dendolimer, polyimide, polyamic acid, polyarylene, polyamide, polyquinoxaline, polyoxadizole, fluorine-containing polymer, polymer having a polyalkylene oxide structure, and the like can be given.

1.3.2 Surfactant

As examples of the surfactant, a nonionic surfactant, an anionic surfactant, a cationic surfactant, an amphoteric surfactant, and the like can be given. As specific examples, a fluorine-containing surfactant, a silicone surfactant, a polyalkylene oxide surfactant, a poly(meth)acrylate surfactant, and the like can be given. Of these, the fluorine-containing surfactant and the silicone surfactant are preferable.

As examples of the fluorine-containing surfactant, compounds having a fluoroalkyl or fluoroalkylene group in at least one of the terminal, main chain, and side chain, such as 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-3-(perfluorooctanesulfonamide)-propyl-N,N'-dimethyl-N-carboxymethylene ammonium betaine, perfluoroalkyl sulfonamide propyltrimethyl ammonium salt, perfluoroalkyl-N-ethylsulfonyl glycine salt, bis(N-perfluorooctylsulfonyl-N-ethylaminoethyl)phosphate, and monoperfluoroalkylethyl phosphate can be given.

As examples of commercially available products of the fluorine-containing surfactant, Megafac F142D, F172, F173, F183 (manufactured by Dainippon Ink and Chemicals, Inc.), Eftop EF301, EF303, EF352 (manufactured by Shin-Akita Kasei Co., Ltd.). Fluorad FC-430, FC-431 (manufactured by Sumitomo 3M, Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), and NBX-15 (manufactured by NEOS Co., Ltd.) can be given. Of these, Megafac F172, BM-1000, BM-1100, and NBX-15 are particularly preferable.

As the silicone surfactant, SH7PA, SH21PA, SH28PA, SH30PA, ST94PA (manufactured by Toray-Dow Corning Silicone Co., Ltd.) and the like may be used. Of these, SH28PA and SH30PA are particularly preferable.

The surfactant is used in an amount of usually 0.00001 to 1 part by weight for 100 parts by weight of the polymer formed of the compounds 1 to 3. The surfactant may be used either individually or in combination of two or more.

1.3.3 Silane Coupling Agent

As examples of the silane coupling agent, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3,6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, and the like can be given. The silane coupling agent may be used either individually or in combination of two or more.

2. Film Formation Method

A method of forming a silica-based film according to the invention includes applying the film forming composition to a substrate to form a coating, heating the coating, and applying ultraviolet radiation to the coating to effect a curing treatment.

The curing by ultraviolet radiation application may be performed under the following conditions. The ultraviolet irradiation has a wavelength of usually 250 nm or less, but 150 nm or more, and preferably 150 to 200 nm. It is preferable to use a light source which emits ultraviolet irradiation having a plurality of wavelengths in order to prevent a local change in film quality due to the standing wave caused by reflection from the substrate. The condensation reaction of the silane compound can be performed at a low temperature in a short time without using a UV-active reaction promoter by using ultraviolet radiation having a wavelength within this range. If ultraviolet radiation having a wavelength exceeding 250 nm is used, a promoting effect on the condensation reaction of the organic silica sol is not obtained. If the wavelength is too short, decomposition of the organic group of the organic silica or elimination of the organic group from the silicon atom may occur.

In the coating curing treatment of the invention, it is preferable to perform ultraviolet radiation application and heating at the same time. The heating may be performed at preferably 100 to 450° C., and still more preferably 250 to 400° C. As the heating method, a hot plate, ultraviolet radiation lamp annealing, or the like may be used.

If the coating heating temperature (e.g. substrate temperature) is lower than 100° C., a sufficient crosslink density may not be obtained and the coating may not be cured. If the substrate temperature exceeds 450° C., the resulting film may be decomposed, thereby making it difficult to conform to the conditions for the copper damascene interconnect manufacture which is the main application of the invention.

The ultraviolet radiation may be applied after activating the coating by heating the substrate at 100 to 450° C. before applying the ultraviolet radiation to the coating.

In the invention, the ultraviolet radiation application may be performed in a gas having an oxygen partial pressure of preferably 0.1 kPa or less, and still more preferably 0.01 kPa or less. As the gas used, $N_2$, He, Ar, Kr, Xe, $CH_4$, $CO_2$, CO, and $H_2O$ (preferably $N_2$, He, and Ar) can be given. If the ultraviolet radiation application is performed in an atmosphere at a high oxygen concentration, ozone is produced by the ultraviolet radiation and oxidizes the surface of the film, whereby sufficient hydrophobicity cannot be maintained.

The ultraviolet radiation application may be performed under normal pressure, increased pressure, or reduced pressure. The pressure is preferably 0.001 to 1000 kPa, and still more preferably 0.001 to 101.3 kPa. If the pressure is within the above preferable range, the elimination reaction is further promoted, whereby the condensation reaction can be promoted.

In order to control the curing rate of the coating film, step-wise heating may be performed, or an atmosphere such as nitrogen, air, oxygen concentration, and pressure may be selected, if necessary. A silica-based film can be produced by these steps.

As examples of the substrate to which the film forming composition is applied, Si-containing layers such as Si, $SiO_2$, SiN, SiC, and SiCN can be given. As the method for applying the film forming composition to the substrate, a coating method such as spin coating, dip coating, roll coating, or spray coating may be used. After applying the silica-based film forming composition to the substrate, the solvent is removed to form the coating. A coating with a dry thickness of 0.05 to 2.5 μm is obtained by single application, and a coating with a dry thickness of 0.1 to 5.0 μm is obtained by double application. A silica-based film can be formed by subjecting the resulting coating to the curing treatment.

3. Silica-based Film

The silica-based film of the invention has an extremely high Δk and modulus of elasticity and exhibits a low dielectric constant as is clear from examples described later.

The organic silica-based film of the invention has a sufficiently high crosslink density and high hydrophobicity from the viewpoint of the Δk, modulus of elasticity, and the like of the film. In more detail, the organic silica-based film of the invention has a dielectric constant of preferably 1.5 to 3.2, and still more preferably 1.8 to 3.0, a modulus of elasticity of preferably 4.0 to 15.0 GPa, and still more preferably 4.0 to 12.0 GPa, and a film density of preferably 0.7 to 1.3 $g/cm^3$, and still more preferably 0.8 to 1.27 $g/cm^3$. Therefore, the organic silica-based film of the invention exhibits excellent insulating film properties such as mechanical strength and dielectric constant.

The organic silica-based film of the invention has a water contact angle of preferably 60 degrees or more, and still more preferably 70 degrees or more. This indicates that the organic silica-based film of the invention is hydrophobic so that the organic silica-based film can maintain a low dielectric constant due to low hygroscopicity. The organic silica-based film is rarely damaged by RIE used in the semiconductor process due to low hygroscopicity, and exhibits excellent chemical resistance against a wet cleaning liquid. In particular, this tendency is significant in an organic silica-based film having a dielectric constant k of 2.5 or less in which the insulating film has a porous structure.

As described above, the organic silica-based film of the invention has characteristics such as (a) excellent insulating film properties such as a dielectric constant and a modulus of elasticity and capability of being formed at a low temperature in a short time since the film forming composition includes an organic silica sol including a specific substituent, (b) the absence of a substance contaminating a semiconductor device since it is unnecessary for the film forming composition to include an ionic substance such as a UV-active acid generator, base generator, and photosensitizer, a charge carrier, or a corrosive compound generation source, (c) being cured by a curing method which rarely causes damage to the transistor structure formed by the semiconductor process such as RIE and allows the single-wafer process, (d) a low dielectric constant due to high hydrophobicity and low hygroscopicity, and (e) the capability of withstanding formation of a copper damascene structure or the like due to excellent mechanical strength as evidenced by a greater modulus of elasticity.

The film forming composition of the invention includes the organic silica sol into which the component shown by the general formula (A1) or (A2) is introduced in which a silicon atom bonds to the α-position or γ-position of an unsaturated bond such as a vinylalkoxysilane. An organic silica-based film having an extremely high modulus of elasticity and lower hygroscopicity can be obtained in a shorter time without using a large amount of tetrafunctional silane compound component as the silane compound, by applying and drying the film forming composition and subjecting the dried composition to heating and ultraviolet radiation application preferably in the absence of oxygen. When the organic silica sol having a vinylsilane bond is applied, dried, and irradiated with ultraviolet radiation under heating, the vinyl group completely disappears in a short time, and the amount of component Q (silicon atom which bonds to four oxygen atoms in the organic silica sol) is increased to a large extent. The details of this reaction mechanism have not been clarified. The reaction mechanism is estimated as follows. The substituent site having the unsaturated bond is excited by ultraviolet radiation application and eliminated from the silicon atom, whereby the reactivity of the silicon atom is increased. As a result, the silicon atom reacts with the silanol present near the silicon atom so that the siloxane site having the unsaturated bond originating in the compound 1 (trifunctional silane compound) is converted to the component Q. This increases the crosslink density and significantly increase the modulus of elasticity. It has been confirmed that, from the $^{13}C$-NMR measurement shown in FIG. 2, the conversion into the component Q predominantly occurs by elimination of the carbon unsaturated bond rather than thermal addition polymerization of the carbon unsaturated bond.

As the technology of using the organic silica sol having a carbon unsaturated bond represented by vinylsilane, a technology of increasing the crosslink density by thermal polymerization of the carbon unsaturated bond site to improve mechanical strength and crack resistance (Japanese Patent Application Laid-Open No. 2000-327933), and a technology used to improve critical surface tension by modifying the surface of an organic silica-based film in order to improve adhesion to a CVD film formed as the upper layer (Japanese Patent Application Laid-Open No. 2001-279163 and Japanese Patent Application Laid-Open No. 2002-38091) have been known. However, it has not been reported that the carbon unsaturated bond site is converted into the component Q by applying ultraviolet irradiation as in the invention, whereby the crosslink density of the organic silica-based film is increased to obtain an organic silica-based film having high hardness and a high modulus of elasticity. According to the invention, since the silanol group is consumed by dehydration polycondensation by heating and the silicon atom activated by elimination of the carbon unsaturated group reacts with the silanol, an organic silica-based film having high hydrophobicity in spite of the high component Q content can be obtained by optimizing the ratio of the residual silanol and the carbon unsaturated bond group in the precursor. The "high component Q content" used herein means that the content of the component Q is preferably 40 mol % or more. In this case, the component Q includes the component Q as the monomer and the compound 1 converted into the component Q by the curing treatment using ultraviolet radiation and heat.

As described above, since the silica-based film according to the invention has a low dielectric constant and excellent mechanical strength as evidenced by the high modulus of elasticity, the silica-based film is particularly useful as an interlayer dielectric for a semiconductor device such as an LSI, system LSI, DRAM, SDRAM, RDRAM, or D-RDRAM. Moreover, the silica-based film can be suitably used in semiconductor device applications such as an etching stopper film, a protective film such as a surface coating film for a semiconductor element, an intermediate layer used in the semiconductor device manufacturing process using a multilayer resist, an interlayer dielectric for a multilayer interconnect substrate, a protective film and an insulating film for a liquid crystal display element, and the like.

4. Example

The invention is described below in more detail by way of examples. However, the invention should not be construed as being limited to the following examples. In the examples and comparative examples, "part" and "%" respectively indicate "part by weight" and "wt %" unless otherwise indicated.

4.1. Examples and Comparative Examples

A film forming composition was produced and a silica-based film was formed as described below.

4.1.1 Method of Producing Film Forming Composition

4.1.1a Example 1

A quartz flask equipped with a condenser was charged with 31.8 g of a 20% tetrabutylammonium hydroxide aqueous solution, 143.4 g of ultrapure water, and 448.4 g of ethanol. The mixture was stirred at 25° C. After the continuous addition of 36.2 g of vinyltrimethoxysilane as the compound 1 and 19.9 g of methyltrimethoxysilane and 20.3 g of tetraethoxysilane as silane compounds other than the compound 1 in one hour, the mixture was stirred at 60° C. for one hour. After cooling the reaction solution to room temperature, 1183.6 g of propylene glycol monopropyl ether and 30.6 g of a 20% maleic acid aqueous solution were added. The reaction solution was concentrated under reduced pressure until the solid content became 10% to obtain a film forming composition 1 having a sodium content of 0.7 ppb, a potassium content of 0.4 ppb, and an iron content of 1.7 ppb.

4.1.1b Example 2

A quartz flask equipped with a condenser was charged with 5.6 g of a 25% tetrabutylammonium hydroxide aqueous solution, 181.0 g of ultrapure water, and 460.9 g of ethanol. The mixture was stirred at 25° C. After the continuous addition of 11.9 g of vinyltriethoxysilane as the compound 1 and 21.2 g of methyltrimethoxysilane and 19.5 g of tetraethoxysilane as silane compounds other than the compound 1 in one hour, the mixture was stirred at 60° C. for one hour. After cooling the reaction solution to room temperature, 1283.8 g of propylene glycol monopropyl ether and 15.12 g of a 20% maleic acid aqueous solution were added. The reaction solution was concentrated under reduced pressure until the solid content became 10% to obtain a film forming composition 2 having a sodium content of 0.9 ppb, a potassium content of 0.6 ppb, and an iron content of 1.5 ppb.

4.1.1c Example 3

A quartz flask equipped with a condenser was charged with 18.0 g of a 25% tetramethylammonium hydroxide aqueous solution, 283.6 g of ultrapure water, and 306.3 g of ethanol. The mixture was stirred at 25° C. After the continuous addition of 16.2 g of allyltrimethoxysilane as the compound 1 and 44.6 g of methyltriethoxysilane and 31.2 g of tetraethoxysilane as silane compounds other than the compound 1 in one hour, the mixture was stirred at 60° C. for one hour. After cooling the reaction solution to room temperature, 1179.8 g of propylene glycol monopropyl ether and 48.5 g of a 20% maleic acid aqueous solution were added. The reaction solution was concentrated under reduced pressure until the solid content became 10% to obtain a film forming composition 3 having a sodium content of 1.9 ppb, a potassium content of 1.6 ppb, and an iron content of 1.0 ppb.

4.1.1d Example 4

In a quartz flask equipped with a condenser, 40.4 g of methylvinyldimethoxysilane as the compound 1 and 103.9 g of methyltrimethoxysilane and 95.4 g of tetraethoxysilane as silane compounds other than the compound 1 were dissolved in 204.4 g of propylene glycol monoethyl ether. The mixture was stirred using a three-one motor to stabilize the solution temperature at 55° C. Then, 254.2 g of ion-exchanged water, in which 0.36 g of oxalic acid was dissolved, was added to the solution in one hour. The mixture was then allowed to react at 55° C. for three hours. After the addition of 917.2 g of propylene glycol monoethyl ether, the reaction solution was cooled to room temperature. The reaction solution was concentrated under reduced pressure until the solid content became 10% to obtain a film forming composition 4 having a sodium content of 0.7 ppb, a potassium content of 1.8 ppb, and an iron content of 1.2 ppb.

4.1.1e Example 5

In a quartz flask equipped with a condenser, 42.5 g of divinyldimethoxysilane as the compound 1 and 100.4 g of methyltrimethoxysilane and 67.3 g of tetramethoxysilane as silane compounds other than the compound 1 were dissolved in 181.9 g of propylene glycol monoethyl ether. After the addition of 247.1 g of ion-exchanged water to the solution, the mixture was stirred at room temperature for one hour. After the addition of a solution prepared by dissolving 0.11 g of tetrakis(acetylacetonate)titanium in 60.6 g of propylene glycol monoethyl ether, the mixture was allowed to react at 50° C. for three hours. After the addition of 979.2 g of propylene glycol monoethyl ether, the reaction solution was cooled to room temperature. The reaction solution was concentrated under reduced pressure until the solid content became 15%. After the addition of 35.0 g of acetylacetone, propylene glycol monoethyl ether was added so that the solid content became 10% to obtain a film forming composition 5 having a sodium content of 1.7 ppb, a potassium content of 0.6 ppb, and an iron content of 1.8 ppb.

4.1.1f Example 6

A quartz flask equipped with a condenser was charged with 35.8 g of a 20% tetrapropylammonium hydroxide aqueous solution, 225.0 g of ultrapure water, and 349.6 g of ethanol. The mixture was stirred at 40° C. After the continuous addition of 37.3 g of vinyltrimethoxysilane as the compound 1 and 52.4 g of tetraethoxysilane as a silane compound other than the compound 1 in one hour, the mixture was stirred at 80° C. for one hour. After cooling the reaction solution to room temperature, 1149.2 g of propylene glycol monopropyl ether and 34.5 g of a 20% maleic acid aqueous solution were added. The reaction solution was concentrated under reduced pressure until the solid content became 10% to obtain a film forming composition 6 having a sodium content of 2.5 ppb, a potassium content of 1.6 ppb, and an iron content of 1.9 ppb.

4.1.1g Comparative Example 1

A quartz flask equipped with a condenser was charged with 39.2 g of a 20% tetrapropylammonium hydroxide aqueous solution, 176.8 g of ultrapure water, and 389.2 g of ethanol. The mixture was stirred at 40° C. After the continuous addition of 34.5 g of methyltrimethoxysilane and 57.3 g of tetraethoxysilane as silane compounds other than the compound 1 in one hour, the mixture was stirred at 80° C. for one hour. After cooling the reaction solution to room temperature, 1132.0 g of propylene glycol monopropyl ether and 37.8 g of a 20% maleic acid aqueous solution were added. The reaction solution was concentrated under reduced pressure until the solid content became 10% to obtain a film forming composition 7 having a sodium content of 1.1 ppb, a potassium content of 1.2 ppb, and an iron content of 1.4 ppb.

4.1.1h Example 7

A quartz flask equipped with a condenser was charged with 37.6 g of a 15% tetrabutylammonium hydroxide aqueous solution, 46.4 g of ultrapure water, and 545.0 g of isopropanol. The mixture was stirred at 40° C. After the continuous addition of 48.6 g of vinyltrimethoxysilane as the compound 1 and 12.7 g of methyltrimethoxysilane and 9.7 g of tetraethoxysilane as silane compounds other than the compound 1 in one hour, the mixture was stirred at 80° C. for one hour. After cooling the reaction solution to room temperature, 1182.8 g of propylene glycol monopropyl ether and 21.3 g of a 20% maleic acid aqueous solution were added. The reaction solution was concentrated under reduced pressure until the solid content became 10% to obtain a film forming composition 8 having a sodium content of 2.8 ppb, a potassium content of 1.1 ppb, and an iron content of 0.9 ppb.

4.1.2 Method of Forming silica-based Film

Organic silica-based films of Examples 8 to 17 and Comparative Examples 2 to 7 were obtained using the composition and the curing conditions shown in Table 1.

4.1.2a. Examples 8 to 17 and Comparative Example 5

The film forming composition obtained in (1) was applied to an 8-inch silicon wafer using a spin coating method. The coating was dried at 90° C. for one minute on a hot plate and at 200° C. for one minute in a nitrogen atmosphere. The coating was cured by applying ultraviolet radiation while heating the coating on the hot plate to obtain an organic silica-based film sample. Table 1 shows the type of film forming composition and the curing conditions (type of ultraviolet radiation, heating temperature, curing time using heating and UV application).

As the ultraviolet radiation source, a white ultraviolet radiation source emitting ultraviolet radiation having a wavelength of 250 nm or less (hereinafter called "ultraviolet radiation 1") was used.

4.1.2b Comparative Examples 2, 3, and 4

In Examples 8 to 17 and Comparative Example 5, heating and application of the ultraviolet radiation 1 were performed at the same time in the curing treatment. In Comparative Examples 2, 3, and 4, samples were obtained by curing the coating by performing only the heat treatment under the conditions shown in Table 1 without applying ultraviolet radiation.

4.1.2c Comparative Example 6

In Examples 1 to 10 and Comparative Example 4, heating and application of the ultraviolet radiation 1 were performed at the same time in the curing treatment. In Comparative Example 5, a sample was obtained by curing the coating by using ultraviolet radiation obtained by cutting off the wavelength of 250 nm or less of the ultraviolet radiation source 1 using a UV-cut filter (hereinafter called "ultraviolet radiation 2").

4.1.2d Comparative Example 7

In Examples 8 to 17 and Comparative Example 5, heating and application of the ultraviolet radiation 1 were performed at the same time in the curing treatment. In Comparative Example 7, a sample after drying was used without performing the curing treatment.

4.2 Evaluation Method

The organic silica-based film obtained in 4.1.(2) was evaluated as described below.

4.2.1 Dielectric constant and $\Delta k$

A dielectric constant measurement sample was prepared by forming an aluminum electrode pattern by a vapor deposition method on the organic silica-based film formed on an 8-inch N-type silicon wafer having a resistivity of 0.1 $\Omega$.cm or less using the above-described method. The dielectric constant of the organic silica-based film was measured by a CV method at a frequency of 100 kHz using an electrode "HP16451B" and a precision LCR meter "HP4284A" manufactured by Agilent Technologies.

The $\Delta k$ is the difference between the dielectric constant (k@RT) measured at 24° C. and 40% RH and the dielectric constant (k@200° C.) measured at 200° C. in a dry nitrogen atmosphere ($\Delta k = k@RT - k@200°\ C$). An increase in the dielectric constant of the film due to moisture absorption can be evaluated by the $\Delta k$. An organic silica-based film is determined to have high hygroscopicity when the $\Delta k$ is 0.15 or more.

4.2.2 Modulus of Elasticity of Silica-based Film

A Berkovich type indenter was installed in a nanohardness tester (Nanoindenter XP) manufactured by MTS, and the modulus of elasticity of the insulating film formed by the above-described method was measured by a continuous stiffness measurement method.

4.2.3 FT-IR

The FT-IR measurement was carried out using an FT-IR spectrometer (FTS 3000) manufactured by Digilab Japan Co., Ltd.

4.2.4 $^{13}$C-CPMAS NMR

The sample was packed into a zirconia rotor having an outer diameter of 7 mm, and $^{13}$C-NMR measurement was carried out by a cross-polarization magic angle spinning (CP-MAS) method using a 300 MHz Fourier transform NMR spectrometer (Advance 300 manufactured by Bruker). The measurement was carried out at a measurement temperature of 30° C., a pulse interval of 5 sec, a sample tube rotational speed of 3000 to 7000 Hz, a center frequency of 75.48 MHz, a frequency range of 26.46 kHz, a data point of 16 k, and a number of transients of 10 to 5,000. Glycine was subjected to the measurement in advance as a chemical shift standard sample. The decoupler frequency offset value when correcting the peak of a carbonyl group to 176.03 ppm was read, and the value of each sample was corrected by inputting the value in the measurement of each sample.

TABLE 1

| Example | Composition | Ultraviolet radiation | Heating temperature (° C.) | Curing time (min) | Dielectric constant | Δk | Modulus of elasticity |
|---|---|---|---|---|---|---|---|
| Example 8 | 2 | 1 | 400 | 1 | 2.20 | 0.06 | 4.2 |
| Example 9 | 2 | 1 | 400 | 3 | 2.22 | 0.05 | 5.0 |
| Example 10 | 2 | 1 | 400 | 6 | 2.25 | 0.06 | 6.4 |
| Example 11 | 1 | 1 | 400 | 3 | 2.32 | 0.06 | 8.4 |
| Example 12 | 8 | 1 | 400 | 3 | 2.62 | 0.12 | 13.3 |
| Example 13 | 6 | 1 | 400 | 3 | 2.35 | 0.08 | 8.8 |
| Example 14 | 3 | 1 | 400 | 3 | 2.25 | 0.05 | 4.8 |
| Example 15 | 4 | 1 | 400 | 3 | 2.91 | 0.09 | 9.5 |
| Example 16 | 5 | 1 | 400 | 3 | 2.82 | 0.08 | 10.0 |
| Example 17 | 2 | 1 | 100 | 6 | 2.25 | 0.08 | 4.5 |
| Comparative Example 2 | 2 | None | 400 | 6 (only heating) | 2.36 | 0.21 | 3.20 |
| Comparative Example 3 | 7 | None | 420 | 60 (only heating) | 2.24 | 0.10 | 5.2 |
| Comparative Example 4 | 7 | None | 420 | 6 (only heating) | 2.30 | 0.20 | 3.1 |
| Comparative Example 5 | 7 | 1 | 400 | 3 | 2.24 | 0.16 | 4.3 |
| Comparative Example 6 | 2 | 2 | 400 | 6 | 2.20 | 0.15 | 3.0 |
| Comparative Example 7 | 2 | None | None | — | — | — | — |

4.3 Evaluation Results

4.3.1 Dielectric Constant, Δk, and Modulus of Elasticity

The dielectric constant, Δk, and modulus of elasticity were determined for the silica-based films obtained in Examples 8 to 17 and Comparative Examples 2 to 7. The evaluation results are shown in Table 1.

In Examples 8 to 10, the composition 2, in which the content of the compound (compound 1) shown by the general formula (A) effective for curing by ultraviolet radiation (UV curing) was 20 mol %, was cured (UV cured) by applying ultraviolet radiation for 1, 3, or 6 minutes. In Comparative Example 2, the composition 2 was cured by heating for six minutes.

In Examples 8 to 10, a low Δk and a high modulus of elasticity were obtained, whereby an insulating film having excellent characteristics was obtained. In Comparative Example 2, since the composition was cured by heating at the same temperature without applying ultraviolet radiation, an insulating film having a considerably high Δk was obtained. This is considered to be because the reaction of the silane compound did not sufficiently proceed so that the amount of residual silanol group was not sufficiently decreased. From these results, it was found that the curing treatment by heating and ultraviolet radiation application is indispensable for the composition of the invention. It was also found that the composition of the invention exhibits excellent characteristics in a sufficiently short curing time which enables single-wafer processing when the composition is cured by heating and ultraviolet radiation application.

In Comparative Examples 3 and 4, the composition 7 in which the content of the compound 1 was 0 mol % was used. In Comparative Example 3, a dielectric constant, Δk, and modulus of elasticity effective as a low-dielectric-constant interlayer dielectric were obtained as a result of curing the composition by heating for a long time of 60 minutes. In Comparative example 4 in which the composition was cured at a lower temperature and a shorter time in comparison with Comparative Example 3, a high Δk and a low modulus of elasticity were obtained. This suggests that the condensation reaction of the silane compound did not proceed in Comparative Example 4 and that the reaction does not proceed by curing by heating for a short time.

In Comparative Example 5 and Examples 9, 11, and 12, the composition in which the content of the compound 1 was respectively 0 mol %, 20 mol %, 50 mol %, and 70 mol % was cured by applying ultraviolet radiation for three minutes.

In Comparative Example 5, a high Δk and a low modulus of elasticity were obtained, whereby an insulating film having unfavorable characteristics was obtained. In Examples 9 and 11, a low Δk and a high modulus of elasticity were obtained, whereby an insulating film having excellent characteristics was obtained. In Example 12, since a very high modulus of elasticity was obtained, it was confirmed that curing proceeded to a greater degree in comparison with Examples 9 and 11. However, the dielectric constant was increased and the Δk was increased to some extent.

It is considered that, from the FT-IR and NMR results as described later, the reaction caused by UV curing proceeds by elimination of the substituent of the compound 1. In the case where the concentration of the substituent is too high, the side reaction between the substituents occurs, whereby the dielectric constant and the Δk are increased. From these results, it was found that the content of the compound 1 is preferably 70 mol % or less.

In Example 13, the composition of the composition of Example 11 other than the compound 1 was changed. In Example 13, a low Δk and a high modulus of elasticity were obtained in the same manner as in Example 11.

In Examples 14 to 16, the substituent of the compound 1 included in the composition 2 was changed from the vinyl group to the allyl group, methyl group+vinyl group, and vinyl group+vinyl group, respectively. In Examples 14 to 16, an insulating film having a high modulus of elasticity and a low Δk while exhibiting a sufficiently low dielectric constant was obtained.

Example 17 is the same as Example 10 except that the UV curing temperature was set at 100° C. In Example 17, an insulating film having excellent characteristics with a low Δk and a high modulus of elasticity comparable to those of Example 8, in which the curing time of Example 10 was changed from six minutes to one minute, was obtained. However, the modulus of elasticity was lower than that of Example 8. This suggests that the condensation reaction of the silane compound proceed to a greater extent at a higher temperature.

Comparative Example 6 is the same as Example 10 except for using the ultraviolet radiation 2 obtained by cutting off the wavelength of 250 nm or less instead of the ultraviolet radiation 1 of Example 10. In Comparative Example 6, since a high Δk and a low modulus of elasticity were obtained, it was found that the condensation reaction of the silane compound did not sufficiently proceed. Therefore, it was found that the wavelength effective for UV curing is 250 nm or less.

4.3.2 FT-IR

The infrared absorption spectrum was determined for the silica-based films obtained in Examples 8 to 10 and Comparative Examples 2 and 7.

The coatings of Examples 8 to 10 were obtained by curing the composition 2 by applying ultraviolet radiation for 1, 3, and 6 minutes, respectively, under heating. The coating of Comparative Example 2 was obtained by curing the composition by heating, and the coating of Comparative Example 7 was not provided with the curing treatment. FIG. 1 shows the FT-IR results of these coatings. In FIG. 1, a line indicated by a symbol "a" indicates the results of Comparative Example 7, a line indicated by a symbol "b" indicates the results of Comparative Example 2, and lines indicated by symbols "c", "d", and "e" respectively indicate the results of Examples 8, 9, and 10.

As shown in FIG. 1, peaks of C=C and =CH$_2$ were observed in the spectra of Comparative Examples 2 and 7. On the other hand, it was confirmed that these peaks were decreased or disappeared in Examples 8 to 10. It was found that these peaks are decreased as the ultraviolet radiation application time is increased.

4.3.3 $^{13}$C-CPMAS NMR

The amount of the substituent of the composition in the film was evaluated for the silica-based films obtained in Example 10 and Comparative Example 2 by NMR.

Figure 2:
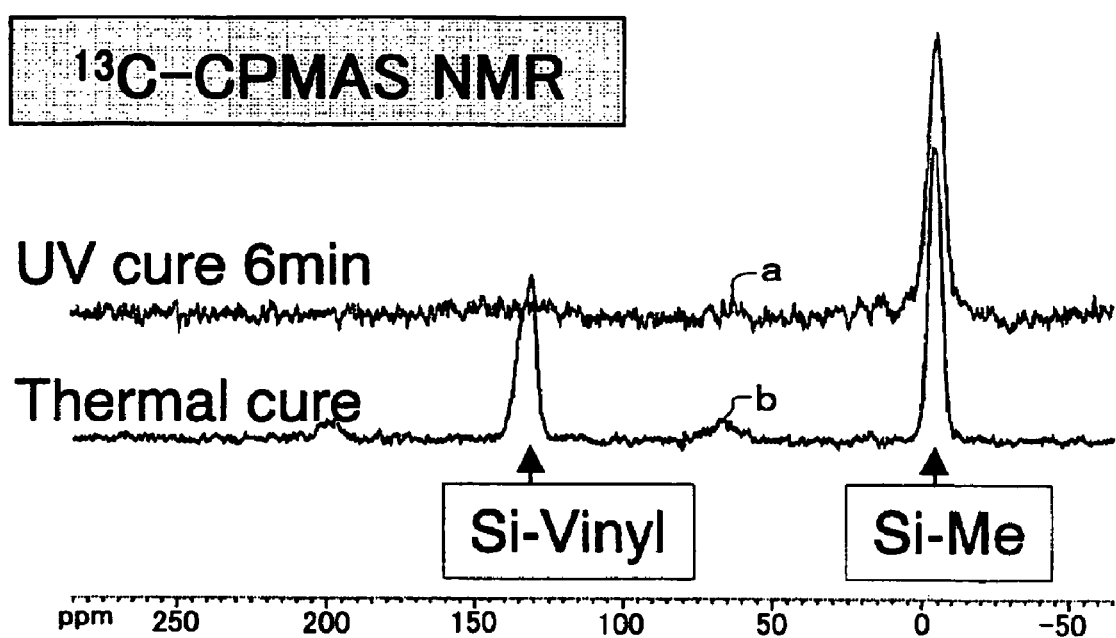
FIG. 2 shows $^{13}$C-CPMAS NMR.

FIG. 2 shows the $^{13}$C-CPMAS NMR results obtained for Example 10 in which the composition 2 including a vinyl group was cured by heating and UV curing and Comparative Example 2 in which the composition was cured only by heating. In FIG. 2, a line indicated by a symbol "a" indicates the results of Example 10, and a line indicated by a symbol "b" indicates the results of Comparative Example 2.

As shown in FIG. 2, it was confirmed that, while the peak of an Si-vinyl group was observed in the spectrum of Comparative Example 2, this peak disappeared in Example 10.

From the FT-IR and NMR results, it was found that the vinyl group of the compound 1 was eliminated by heating and UV curing. It is considered that elimination of the vinyl group causes the elimination site to react with the silanol group, whereby the condensation proceeds. Since the vinyl group is eliminated only by ultraviolet radiation application, it is considered that excitation by ultraviolet radiation is necessary for elimination of the vinyl group.

As is clear from the above results, it was confirmed that the invention enables formation of a silica-based film having significantly improved characteristics (particularly modulus of elasticity and Δk) in comparison with the comparative examples. Therefore, the silica-based film obtained according to the invention exhibits excellent mechanical strength and a low dielectric constant, and can be suitably used as an interlayer dielectric for a semiconductor device and the like.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A method of forming a silica-based film, the method comprising:

applying a composition for forming an insulating film for a semiconductor device, which is cured by using heat and ultraviolet radiation, to a substrate to form a coating;

heating the coating; and applying heat and ultraviolet radiation to the coating to effect a curing treatment;

wherein the composition includes:

a hydrolysis-condensation product produced by hydrolysis and condensation of at least one silane compound selected from the group consisting of compounds shown by the following general formula (A), and at least one silane compound selected from the group consisting of compounds shown by the following general formula (B) and compounds shown by the following general formula (C); and an organic solvent,

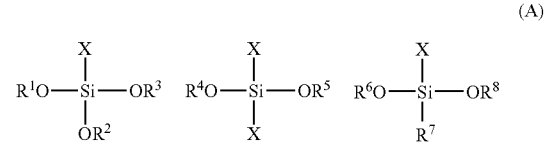

(A)

wherein $R^1$ to $R^8$ individually represent an alkyl group or an aryl group, and X represents the following general formula (A1) or (A2),

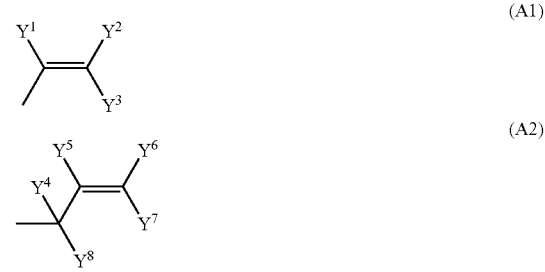

wherein $Y^1$ to $Y^8$ individually represent a hydrogen atom, a fluorine atom, an alkyl group, or an aryl group, provided that $Y^1$ and $Y^2$ or $Y^5$ and $Y^6$ may form a ring in combination,

wherein $R^9$ and $R^{10}$ represent an alkyl group or an aryl group, and a represents an integer from 0 to 3,

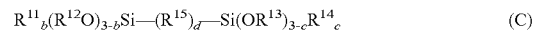

wherein $R^{11}$ to $R^{14}$ individually represent an alkyl group or an aryl group, b and c individually represent an integer from 0 to 2, $R^{15}$ represents an oxygen atom, a phenylene group, or a group —(CH$_2$)$_m$— (wherein m represents an integer from 1 to 6), and d represents 0 or 1.

2. The method according to claim 1, wherein the heat and the ultraviolet radiation are applied at the same time.

3. The method according to claim 1, wherein the heating is performed at 100 to 450° C.

4. The method according to claim 1, wherein the ultraviolet radiation has a wavelength of 250 nm or less.

5. A silica-based film having a dielectric constant of 1.5 to 3.2, a film density of 0.7 to 1.3 g/cm$^3$, and a water contact angle of 60 degrees or more, the silica-based film being obtained by the method according to any of claims 1 to 4.

6. An interconnect structure, comprising the silica-based film according to claim 5 as an interlayer dielectric.

7. A semiconductor device, comprising the interconnect structure according to claim 6.

8. A composition for forming an insulating film for a semiconductor device, which is used in the method according to any of claims 1 to 4 and is cured by using heat and ultraviolet radiation, the composition comprising:

a hydrolysis-condensation product produced by hydrolysis and condensation of at least one silane compound selected from the group consisting of the compounds shown by the general formula (A), and at least one silane compound selected from the group consisting of the compounds shown by the general formula (B) and the compounds shown by the general formula (C); and an organic solvent.

9. The composition according to claim 8, wherein the content of the compounds shown by the general formula (A) in the silane compound is 60 mol % or less.

10. The composition according to claim 8, wherein two or more silane compounds selected from the group consisting of the compounds shown by the general formula (B) and the compounds shown by the general formula (C) are used.

11. The composition according to claim 10, wherein the two or more silane compounds selected from the group consisting of the compounds shown by the general formula (B) and the compounds shown by the general formula (C) are an alkyltrialkoxysilane and a tetraalkoxysilane.

12. The composition according to claim 8, which does not include an ultraviolet radiation active reaction promoter.

13. The composition according to claim 12, wherein the reaction promoter is one of, or a combination of, a reaction initiator, an acid generator, a base generator, and a sensitizer having an ultraviolet radiation absorption function.

14. The composition according to claim 8, wherein the content of Na, K, and Fe is respectively 100 ppb or less.

15. The composition according to claim 8, wherein the ultraviolet radiation has a wavelength of 250 nm or less.

\* \* \* \* \*